US012751264B2

(12) United States Patent
Xie et al.

(10) Patent No.: US 12,751,264 B2
(45) Date of Patent: Sep. 29, 2026

(54) FIELD EFFECT TRANSISTOR WITH BACKSIDE SOURCE/DRAIN

(71) Applicant: INTERNATIONAL BUSINESS MACHINES CORPORATION, Armonk, NY (US)

(72) Inventors: Ruilong Xie, Niskayuna, NY (US); Lawrence A. Clevenger, Saratoga Springs, NY (US); Brent A. Anderson, Jericho, VT (US); Kisik Choi, Watervliet, NY (US); Su Chen Fan, Cohoes, NY (US); Shogo Mochizuki, Mechanicville, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 944 days.

(21) Appl. No.: 17/937,955

(22) Filed: Oct. 4, 2022

(65) Prior Publication Data

US 2024/0112985 A1 Apr. 4, 2024

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01);
(Continued)

(58) Field of Classification Search
CPC ............. H10D 84/853; H10D 30/6735; H10D 30/6757; H10D 62/121; H10D 62/151; H10D 30/014; H10D 30/43; H10D 64/258; H10D 64/254; H10D 84/85; H10D 84/83; H10D 84/0186; H10D 84/0149; H10D 84/038; H10D 88/00; H10D 88/01; H10D 64/017; H10D 30/019; H10D 30/501; H10D 84/0177; H10D 84/83135; H10D 84/0167; H10D 84/017; H10D 62/364; H01L 23/481; H01L 23/485; H01L 23/5286;
(Continued)

(56) References Cited

U.S. PATENT DOCUMENTS

| | | | |
|---|---|---|---|
| 9,466,723 | B1 | 10/2016 | Huang |
| 10,636,883 | B2 | 4/2020 | Blank |
| 11,164,781 | B2 | 11/2021 | Sun |
| 11,342,413 | B2 | 5/2022 | Huang |

(Continued)

OTHER PUBLICATIONS

List of IBM Patents or Patent Applications Treated as Related, Oct. 4, 2022, 2 pgs.
Xie, et al., "Field Effect Transistor With Backside Source/Drain." U.S. Appl. No. 17/937,967, filed Oct. 4, 2022.

*Primary Examiner* — Jonathan Han
(74) *Attorney, Agent, or Firm* — Seed Intellectual Property Law Group LLP

(57) ABSTRACT

A semiconductor device includes a nanostructure field effect transistor (FET). The FET includes a gate and a first source or drain (S/D) region. A frontside S/D contact may be connected to and extends vertically upward from a top surface of the first S/D region. The FET further includes a second S/D region. The second S/D region extends below a bottom surface of the gate. A backside S/D contact may be connected to and extend vertically downward from a bottom surface of the second S/D region.

17 Claims, 18 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |

(52) U.S. Cl.
CPC ..... *H10D 30/6735* (2025.01); *H10D 30/6757* (2025.01); *H10D 62/121* (2025.01); *H10D 62/151* (2025.01); *H10D 84/0167* (2025.01); *H10D 84/017* (2025.01); *H10D 84/0186* (2025.01); *H10D 84/038* (2025.01)

(58) Field of Classification Search
CPC ....... B82Y 10/00; H10B 10/12; H10W 20/20; H10W 20/40; H10W 20/427; H10W 20/481
See application file for complete search history.

(56) References Cited

U.S. PATENT DOCUMENTS

| | | | | |
|---|---|---|---|---|
| 11,362,213 | B2 | 6/2022 | Ju | |
| 2021/0035103 | A1 | 2/2021 | Agrawal | |
| 2021/0111115 | A1 | 4/2021 | Patrick | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0336012 | A1* | 10/2021 | Huang | H10D 64/01 |
| 2021/0336019 | A1 | 10/2021 | Su | |
| 2021/0351303 | A1 | 11/2021 | Ju | |
| 2021/0376071 | A1 | 12/2021 | Liu | |
| 2021/0376093 | A1 | 12/2021 | Chu | |
| 2021/0391421 | A1 | 12/2021 | Chu | |
| 2021/0399099 | A1 | 12/2021 | Chu | |
| 2022/0069116 | A1 | 3/2022 | Chen | |
| 2022/0077062 | A1 | 3/2022 | Van et al. | |
| 2022/0157956 | A1 | 5/2022 | Chen | |
| 2024/0113176 | A1 | 4/2024 | Xie et al. | |

* cited by examiner

FIELD EFFECT TRANSISTOR WITH BACKSIDE SOURCE/DRAIN

BACKGROUND

The present disclosure relates to fabrication methods and resulting structures for semiconductor devices. More specifically, the present disclosure relates to fabrication methods and resulting structures for field effect transistors (FETs) with a backside source/drain (S/D) for complementary metal oxide semiconductor (CMOS) technologies.

In certain semiconductor device fabrication processes, many semiconductor devices, such as n-type field effect transistors (nFETs) and p-type field effect transistors (pFETs), may be fabricated on a single wafer. Non-planar transistor device architectures (e.g., fin-type FETs (FinFETs), gate all around (GAA) FETs, nanowire FETs, nanosheet FETs, or the like) can provide increased device density and increased performance over planar transistors. As semiconductor integrated circuits (ICs) and/or chips become smaller, the implementation of stacked nanostructure channels in semiconductor devices has increased. Nanosheets or nanowires generally refer to two-dimensional nanostructures with a thickness range on the order of about 1 nanometer (nm) to about 100 nm, and they can serve as FET channels and facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channels for a reduced device footprint and improved control of channel current flow. Nanosheet transistor configurations may enable fuller depletion in the nanosheet channel regions and reduce short-channel effects. Accordingly, nanosheets and nanowires are seen as feasible options for reducing the footprints of semiconductor transistor devices to 7 nanometers or less.

SUMMARY

In an embodiment of the present disclosure, a semiconductor device is presented. The semiconductor device includes an insulator layer, a transistor upon the insulator layer, and a liner upon a section of the insulator layer. The transistor includes one or more channel regions, a first source or drain (S/D) region upon the insulator layer and connected to the one or more channel regions, and a second S/D region that extends below a top surface of the insulator layer. The liner includes a front portion in contact with a front surface of the second S/D region and a rear portion in contact with a rear surface of the second S/D region.

In another embodiment of the present disclosure, a method of forming a semiconductor device is presented. The method includes forming a mask liner upon a portion of an insulator layer. The method further includes forming a first source or drain (S/D) region upon the insulator layer and contacting respective first end(s) of one or more channel regions. The method further includes forming an S/D trench that exposes respective second end(s) of the one or more channel regions. The S/D trench is formed through the mask liner and extends below an upper surface of the insulator layer. The method further includes forming a second S/D region within the S/D trench. The second S/D region contacts the respective second end(s) of one or more channel regions.

In another embodiment of the present disclosure, a transistor is presented. The transistor includes one or more channel regions, a single gate that is around each of the one or more channel regions, a first source or drain (S/D) region connected to the one or more channel regions, and a second S/D region connected to the one or more channel regions. A bottom surface of the second S/D region is below a bottom surface of the single gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
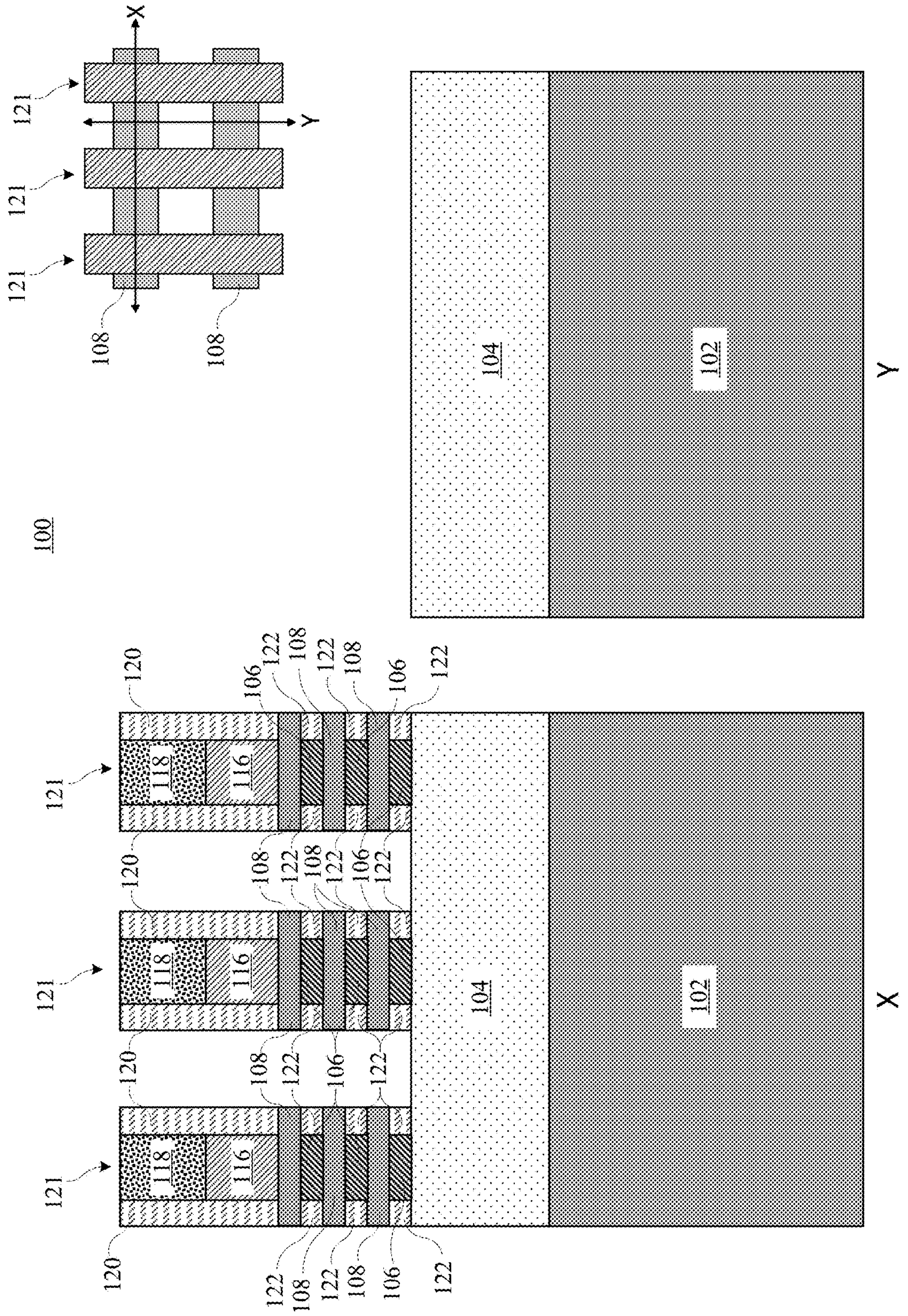
FIG. 1 depicts a partial top-down view and cross-sectional views of a semiconductor device that includes a backside S/D at an intermediate stage of a fabrication process, according to embodiments.

The present disclosure describes nanostructure FET devices, such as a nanosheet GAA FET, and methods of fabrication the FET devices. In particular, the present disclosure describes a FET that includes a backside S/D.

The flowcharts and cross-sectional diagrams in the Figures illustrate methods of fabricating FET devices according to various embodiments. In some alternative implementations, the fabrication steps may occur in a different order that that which is noted in the Figures, and certain additional fabrication steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a GAA nanosheet FET provides a relatively small FET footprint by forming the channel region as a series of nanosheets. In a known GAA configuration, a nanosheet GAA FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

In certain nanostructure FET devices, it has been difficult to integrate a backside S/D contact to contact the S/D from the backside of the semiconductor device. For example, in known nanostructure FET devices, a sacrificial S/D contact is initially formed prior to forming an associated S/D thereupon. Subsequently, the sacrificial S/D contact, may be removed and replaced with a backside S/D contact. The removal of the sacrificial S/D contact is difficult and increases semiconductor device fabrication complexity. Therefore, it may be desirable to fabricate nanostructure FET structures with a backside S/D and/or an associated backside S/D contact without an associated sacrificial S/D contact.

Referring now to the drawings in which like numerals represent the same or similar elements and initially to FIG. 1, this figure depicts a top-down view and cross-sectional views of a semiconductor device 100 at an intermediate stage of the fabrication process, according to embodiments.

The semiconductor device 100 may be formed over a substrate structure. The substrate structure may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In another implementation, as depicted, the substrate structure includes a substrate 102 and an insulator layer 104. The substrate 102 may be comprised of any other suitable material(s) that those listed above and the insulator layer 104 may be a dielectric layer, such as an oxide, and may be referred to as a buried oxide (BOX) layer. The dielectric layer may be any suitable dielectric, oxide, or the like, and it may electrically isolate the nanostructures from the bottom substrate 102.

As shown in FIG. 1, after initial fabrication processing, semiconductor device 100 may include a substrate 102, an insulator layer 104, a nanosheet stack that includes active semiconductor layers 108 and sacrificial layers 106, a sacrificial gate 116, a gate hardmask 118, a gate spacer 120, and inner spacers 122.

The insulator layer 104 may formed on the substrate 102. Thus, in various examples, substrate 102 is provided, insulator layer 104 is deposited over substrate 102, and then the nanosheet stack is formed over the insulator layer 104. Alternatively, the initial substrate may be an insulator on substrate, such as a SiGeOI (SiGe on insulator substrate), a SOI (Silicon on insulator substrate, or the like).

The nanosheet stack may be formed by forming alternating sacrificial layers and active semiconductor layers. In certain examples, the first one of the sacrificial layers is initially formed directly on an upper surface of the insulator layer 104. In other examples, certain layers may be formed between the upper surface of the insulator layer 104 and the first one of the sacrificial layers. In an example, the sacrificial layer is composed of silicon-germanium (e.g., SiGe, where the Ge ranges from about 25-40%). Next, an active semiconductor layer is formed on an upper surface of the first one of the sacrificial layers. In an example, the active semiconductor layer is composed of silicon. Several additional layers of the sacrificial layer and the active semiconductor layer are alternately formed. In the example illustrated, there are a total of three sacrificial layers and three active semiconductor layers that are alternately formed to form the nanosheet stack. However, it should be appreciated that any suitable number of alternating layers may be formed. Although it is specifically contemplated that the sacrificial layers can be formed from SiGe and that the active semiconductor layers can be formed from Si, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor materials can be deposited by any appropriate mechanism. The first and second semiconductor materials (i.e., of the sacrificial layers and the active semiconductor layers) can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

In certain embodiments, the sacrificial layers have a vertical thickness ranging, for example, from approximately 3 nm to approximately 20 nm. In certain embodiments, the active semiconductor layers have a vertical thickness ranging, for example, from approximately 3 nm to approximately 10 nm. Although six total layers are associated with the depicted semiconductor structure 100, it should be appreciated that the nanosheet stack can include any suitable number of layers. Although the range of 3-20 nm is cited as an example range of thickness, other thickness of these layers may be used. In certain examples, certain of the sacrificial layers or the active semiconductor layers may have different thicknesses relative to one another. Therefore, multiple epitaxial growth processes can be performed to form the alternating sacrificial layers and the active semiconductor layers.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers 106.

In some implementations, a mask layer (not shown) is formed on the uppermost active semiconductor layer. The mask layer may be comprised of any suitable material(s) known to one of skill in the art. The mask layer is patterned and used to perform the nanosheet patterning process. In the nanosheet patterning process, any suitable material removal process (e.g., reactive ion etching or RIE) may be used to remove the various layers of the nanosheet stack down to the level of the insulator layer 104. Following the patterning process to the nanosheet stacks, thereby forming sacrificial layers 106 and active semiconductor layers 108, respectively, the mask is removed.

Subsequently, a sacrificial gate 116 is formed on the sacrificial gate oxide layer by any suitable deposition and/or patterning processes known to one of skill in the art. In one example, the sacrificial gate 116 is formed by depositing a thin $SiO_2$ sacrificial gate oxide layer, followed by depositing a layer of amorphous silicon (a-Si) as the sacrificial gate 116. The sacrificial gate 116 may be composed of polycrystalline silicon (poly silicon), amorphous silicon, and/or an oxide, such as, $SiO_2$. A gate hardmask 118 is also formed on a top side of the sacrificial gate 116. The gate hardmask 118 is formed for subsequent nanosheet patterning. The gate hardmask 118 can be composed of various nitride materials including, but not limited to, a nitride, an oxide, silicon nitride (SiN), and/or a combination of a nitride material and an oxide material. In certain embodiments the sacrificial gate 116 extends into and out of the page to wrap around the edges of the nanosheet stack, and the subsequent removal of the sacrificial gate 116 allows an access point for later removal of the sacrificial layers. In certain examples, gate patterning may be performed by first patterning the gate hardmask 118 and then using the patterned gate hardmask 118 to etch the sacrificial gates 116. For clarity, the combined structure of the sacrificial gate 116 and gate hardmask 118 may be referred to herein as a sacrificial gate structure 121.

Subsequently, spacer 120 (or spacer layer) is formed on the sidewalls of the patterned sacrificial gate 116 and the gate hardmask 118. In certain examples, the spacer 120 is also formed over the sacrificial oxide layer.

Subsequently, the semiconductor device 100 is subjected to a directional reactive ion etch (RIE) process, which can remove portions of the sacrificial layers 106 not covered by the sacrificial gate 116 (and the sacrificial gate hardmask 118) and the spacer 120. The RIE can use a boron-based chemistry or a chlorine-based chemistry, for example, which selectively recesses the exposed portions sacrificial layers 106 without significantly removing the active semiconductor layers 108.

Subsequently, inner spacers 122 are added in the recesses that were previously formed into the sacrificial layers 106. In certain embodiments, after the formation of the inner spacers 122, an isotropic etch process is performed to create outer vertical edges to the inner spacers 122 that align with outer vertical edges of the active semiconductor layers 108. In certain embodiments, the material of the inner spacer 122 is a dielectric material such as SiN, SiO, SiBCN, SiOCN, SiCO, etc.

Figure 2:
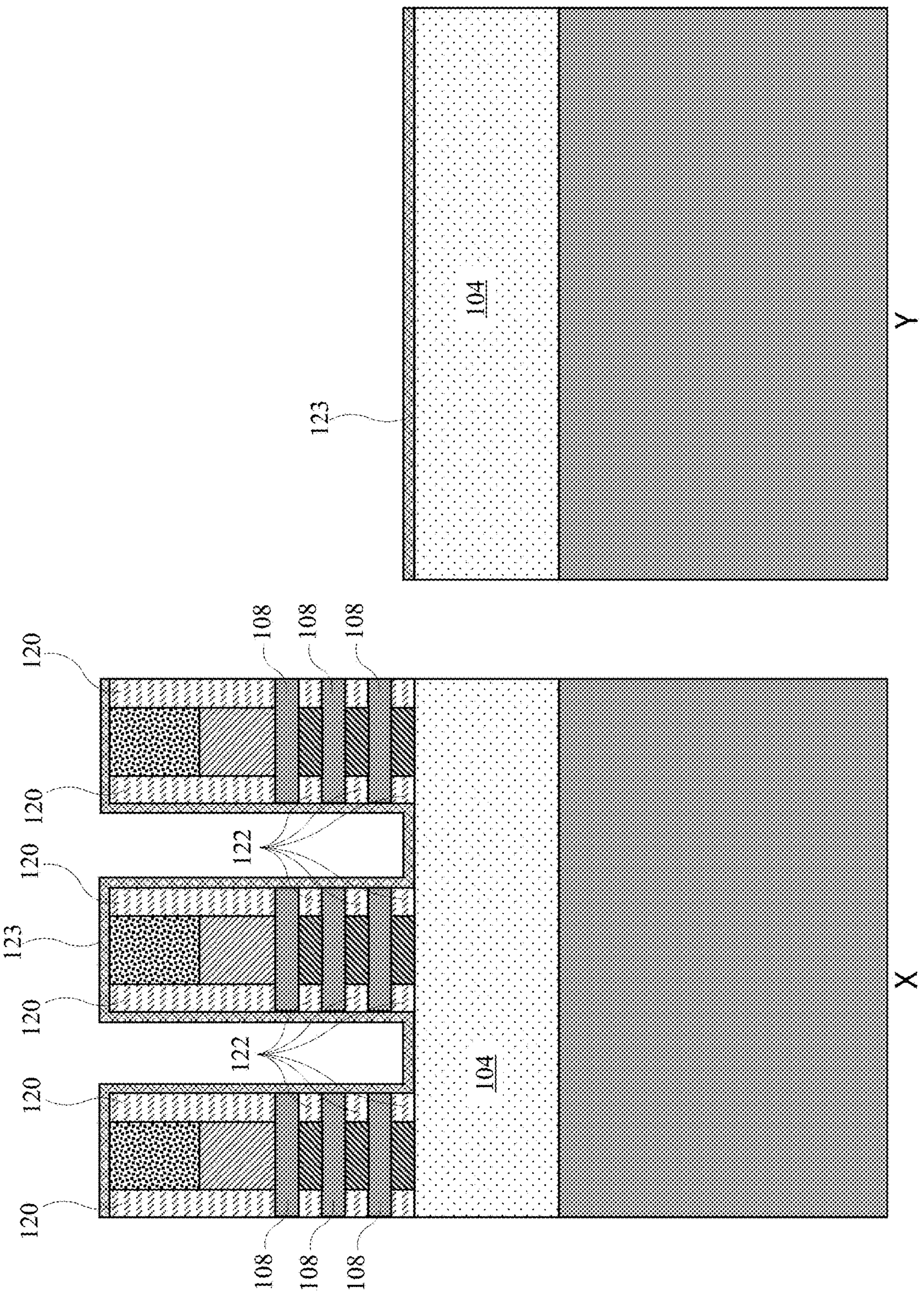
FIG. 2 through FIG. 9 depicts cross-sectional views of a semiconductor device that includes a backside S/D at intermediate stages of the fabrication process, according to embodiments.

Referring now to FIG. 2, this figure depicts cross-sectional views of the semiconductor device 100 after additional fabrication operations where liner 123 is formed. The liner 123 may be formed initially as a blanket layer over semiconductor device 100. For example, the liner 123 may be formed over the insulator layer 104, over the gate spacers 120, over the gate hardmask 118, over the active semiconductor layers 108, over the inner spacers 122, etc. The liner 123 may be formed by depositing a dielectric material or other suitable mask material that prevents epitaxial growth therefrom, such as, for example, SiN, SiBCN, SiOCN, SiOC, SiC, AlN, AlOx, etc. Any known manner of forming the liner 123 can be utilized. The liner 123 can be formed using, for example, CVD, PECVD, ALD, flowable CVD, spin-on dielectrics, or PVD. The liner 123 can be formed to a thickness ranging from 2 nm-6 nm, although different thicknesses are contemplated.

Figure 3:
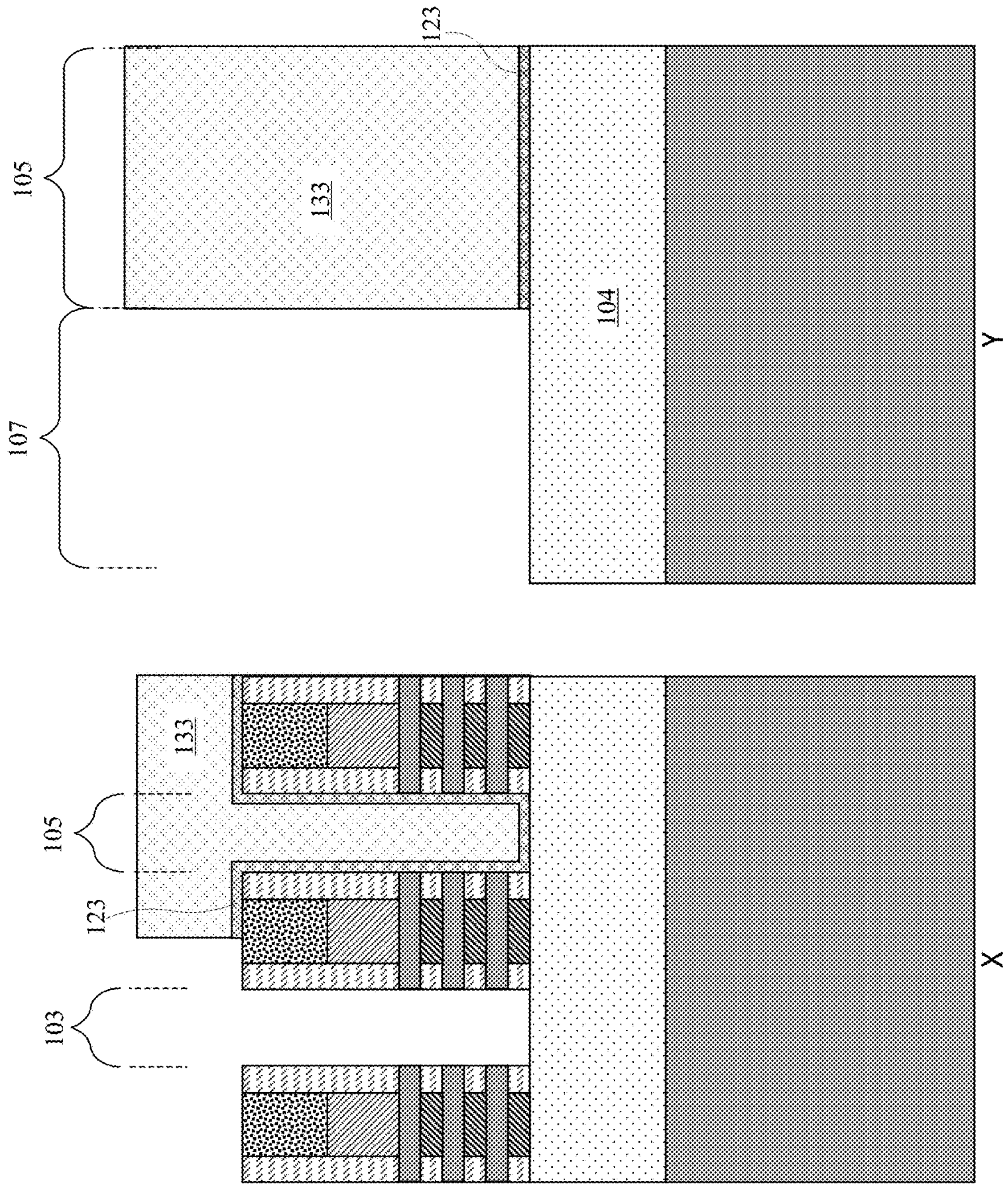

Referring now to FIG. 3, this figure depicts cross-sectional views of the semiconductor device 100 after additional fabrication operations where liner 123 is partially removed or patterned and retained at least within a second source or drain (S/D) location 105. Liner 123 may be patterned by initially forming a mask 133 over liner 123. Subsequently, mask 133 is patterned creating an opening(s) therein over those S/D regions in which liner 123 is not intended to be retained (e.g., openings within mask 133 are formed over first S/D location 103 and over third S/D location 107, etc.). Subsequently, the liner 123 exposed by the openings may be removed, etched, or the like. The mask 133 can be a photolithography mask, hardmask, or the like, and may be composed of various nitride materials including, but not limited to, OPL, amorphous carbon, or the like. In certain examples, mask 133 patterning may be performed by lithography and etching the exposed liner 123 removes the unprotected portion(s) of liner 123. The protected portion(s) of liner 123 (e.g., liner 123 within the second S/D location 105, etc.) may be generally retained. In some examples, liner 123 may be retained in S/D location(s) in which initial S/D regions, such as S/D regions 124, depicted in FIG. 4, are not formed.

The retained liner 123 may be associated with neighboring FETs. For example, and as depicted in the X cross-section, liner 123 may have a first substantially vertical portion upon a sidewall of a first FET structure (e.g. upon respective sidewalls of gate spacer 120, active semiconductor layers 108, inner spacers 122, etc.) and a second substantially vertical portion upon a sidewall of a second FET structure. Further, liner 123 may include a substantially horizontal portion upon the insulator layer 104 between the first and second substantially vertical portions.

Figure 4:
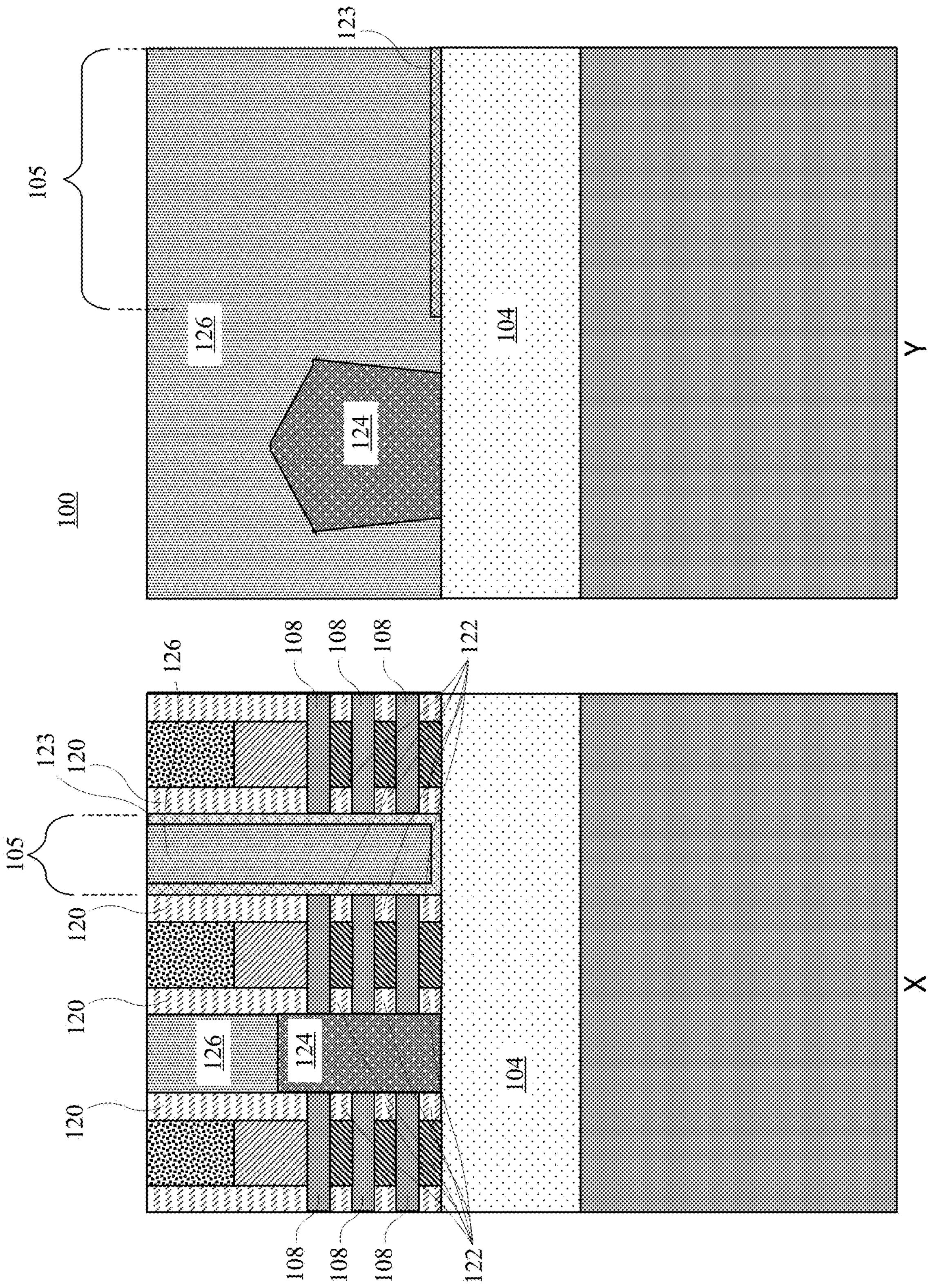

Referring now to FIG. 4, this figure depicts cross-sectional views of the semiconductor device 100 after additional fabrication operations where source/drain (S/D) region 124 is formed over the sidewalls of neighboring nanosheet stacks and over the insulator layer 104 and interlayer dielectric (ILD) 126 is formed over the insulting layer 104, over S/D region 124 and over the liner 123.

The S/D region 124 forms either a source or a drain, respectively, to each neighboring nanostructure stacks. S/D regions 124 may be epitaxially grown or formed. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

The S/D region 124 may be formed by epitaxially growing a source/drain epitaxial region within the recess or opening between neighboring nanostructure stacks. In some examples, S/D region 124 is formed by in-situ doped epitaxial growth. In some embodiments, the S/D region 124 epitaxial growth may overgrow above the upper surface of the semiconductor device 100.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in the S/D region 124 can be in the range of $1\times10^{19}$ $cm^{-3}$ to $2\times10^{21}$ $cm^{-3}$, or preferably between $2\times10^{20}$ $cm^{-3}$ to $7\times10^{20}$ $cm^{-3}$.

In certain implementations, the S/D region 124 may be partially recessed such that an upper portion of the S/D region 124 are removed. For example, the upper portion of the one or more S/D regions 124 may be etched or otherwise removed. The etch may be timed or otherwise controlled to stop the removal of S/D region 124 such that the top surface of S/D region 124 is above the upper surface of the topmost active semiconductor layer 108. For clarity, liner 123 generally prevents formation of an associated S/D region within the second S/D location 105.

Subsequently, mask 133 may be removed, e.g., by ash process, or the like. The liner 123 above the top surface of gate hardmask 118 and/or above the top surface of gate spacers 120 may be removed by a planarization process, such as a CMP, that to results in a planar upper surface for the semiconductor device 100. For example, after the planarization process, the top surfaces of spacers 120, the top surfaces of sacrificial gates 116, the top surface of liner 123, and the top surface of mask 133 may be coplanar.

Subsequently, the ILD 126 may be formed around the S/D region 124, upon insulator layer 104, and over the liner 123. The ILD 126 may be formed by depositing a dielectric material upon S/D region 124, upon insulator layer 104, and upon liner 123. The ILD 126 can be any suitable material, such as, for example, porous silicates, carbon doped oxides, silicon dioxides, silicon nitrides, silicon oxynitrides, or other dielectric materials. Any known manner of forming the ILD 126 can be utilized. The ILD 126 can be formed using, for example, CVD, PECVD, ALD, flowable CVD, spin-on dielectrics, or PVD.

In an example, the ILD 126 may be formed to a thickness above the top surface of the semiconductor device 100 and subsequently etched back such that the top surface of the ILD 126 is coplanar with a top surface of the gate hardmask 118 and/or a top surface of spacer(s) 120. In another example, another planarization process, such as a CMP, may be performed to create a planar surface for the semiconductor device 100.

Figure 5:
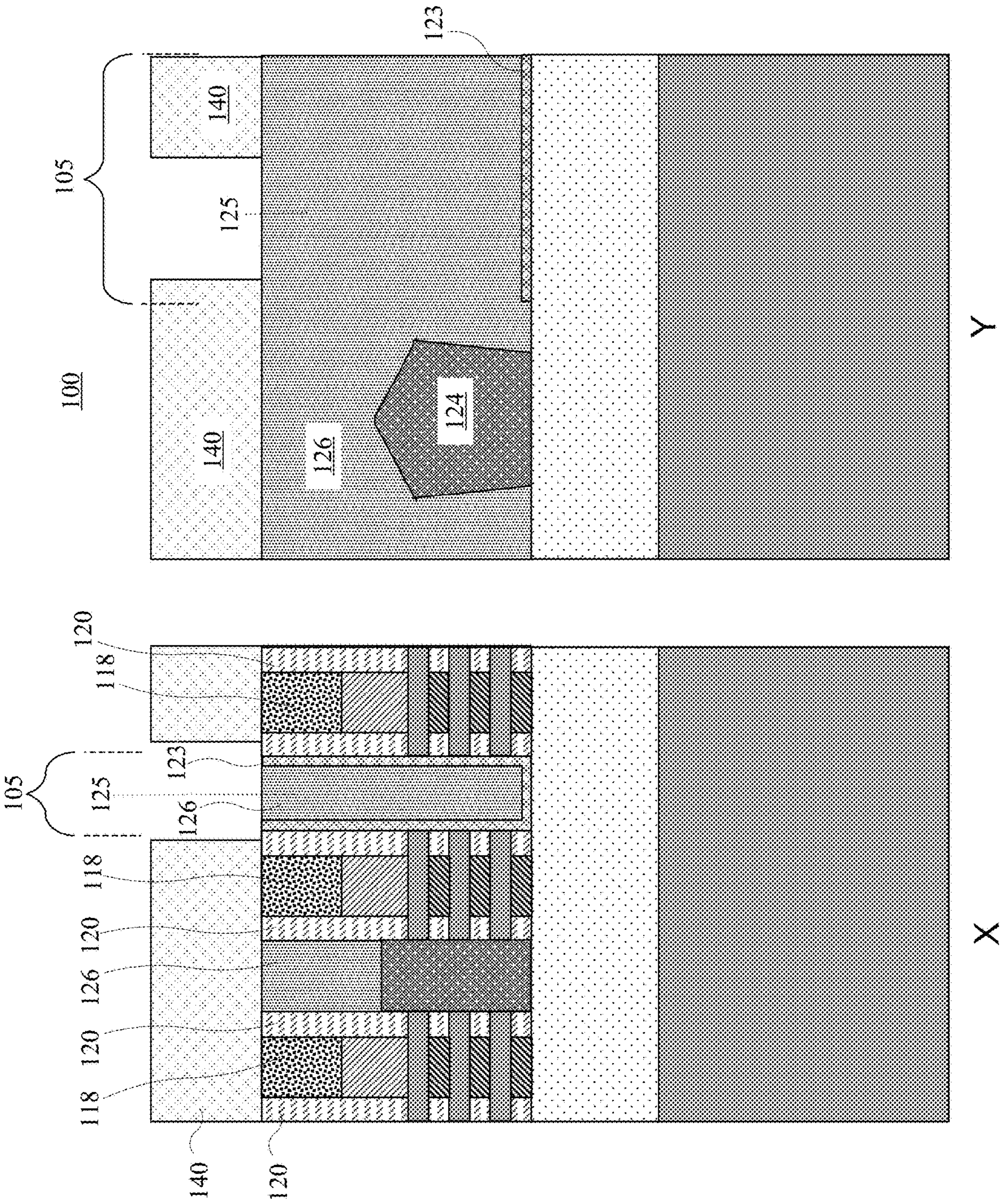
Figure 6:
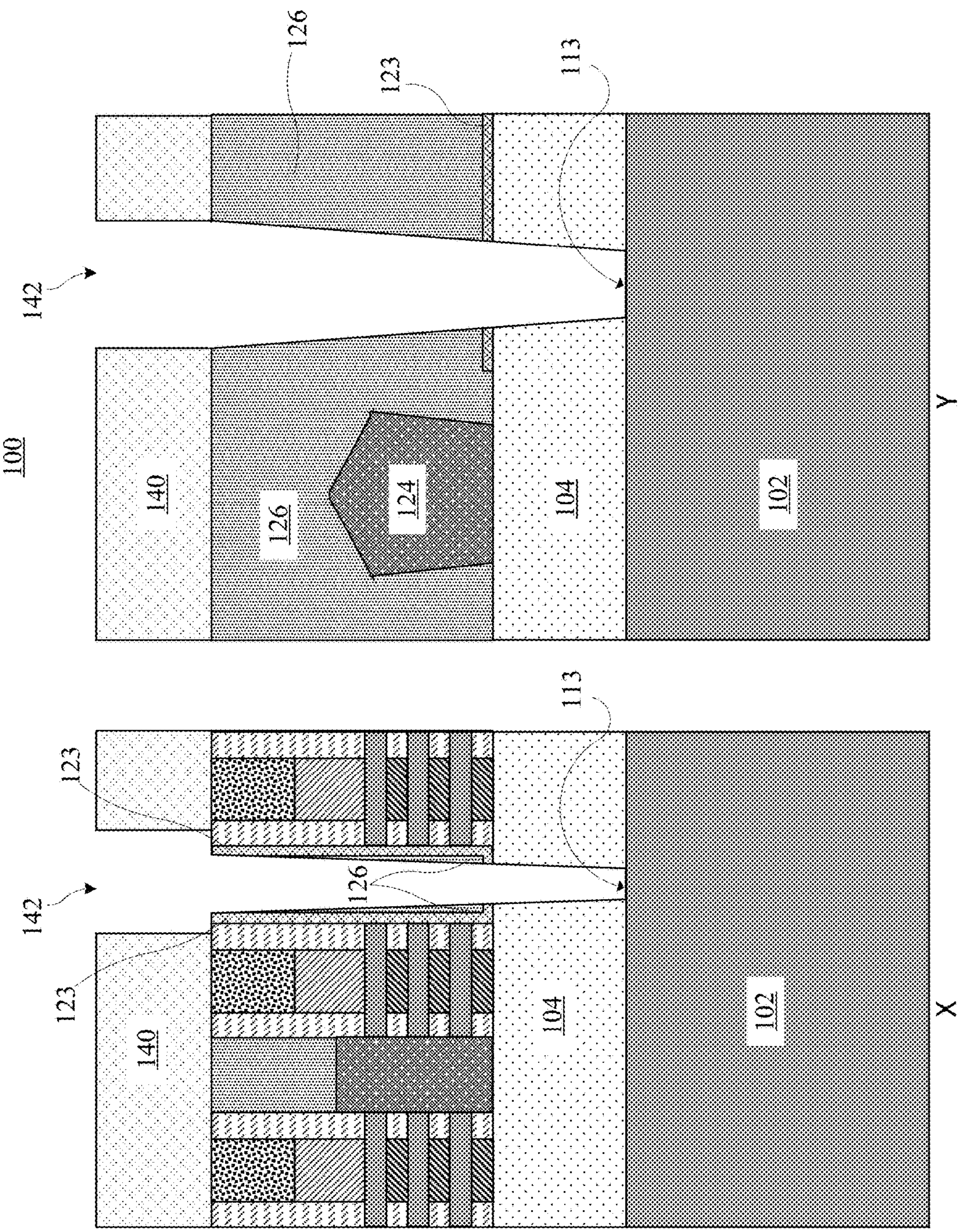

Referring now to FIG. 5, this figure depicts cross-sectional views of the semiconductor device 100 after additional fabrication operations where a mask 140 is formed over ILD 126, over the sacrificial gate structures 121, and/or over spacers 120. The mask 140 is patterned creating an opening therein within second S/D location 105. The mask 140 can be a photolithography mask, hardmask, or the like, and may be composed of various nitride materials including, but not limited to, OPL, TiN, or other materials. In certain examples, mask 140 patterning may be performed by lithography and etching the mask 140 and then using the patterned mask 140 to etch or remove portions of ILD 126, liner 123, and insulator layer 104 to form backside S/D trench 142, as depicted in FIG. 6. For clarity, patterning of mask 140 may form an opening therein with a central axis 125 that is inline or internal to a perimeter or footprint of the liner 123. In one example, as depicted, central axis 125 may be coincident or substantially coincident with a center axis, bisector, or the like, of the neighboring FETs.

Referring now to FIG. 6, this figure depicts cross-sectional views of the semiconductor device 100 after additional fabrication operations where backside S/D trench 142 is formed through the ILD 126, the liner 123, and insulator layer 104 generally below the opening within mask 140. For example, the etching can include a wet chemical etching process in which one or more chemical etchants are used to remove portions of ILD 126, portions of the liner 123, and portions of the insulator layer 104 that are not protected by the patterned mask 140. In examples, the top surface of substrate 102 may be utilized as an etch stop, whereby a portion of the top surface 113 of substrate 102 may be exposed by backside S/D trench 142.

It should be appreciated that appropriate etchants are used, or other etch parameters are selected, to retain the spacers 120, substrate 102, and/or the like during the removal of some portions of ILD 126, the removal of some portions of the liner 123, and the removal of some portions of the insulator layer 104. The etching processes can have etching parameters that can be tuned, such as etchants used, etching temperature, etching solution concentration, etching pressure, source power, RF bias voltage, RF bias power, etchant flow rate, etchant exposure time, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

In some examples, as depicted, some vertical portions of liner 123 that generally line the gate spacer 120, active semiconductor layers 108, and inner spacer 122 sidewall(s) of neighboring FETs may be temporarily retained.

Figure 7:
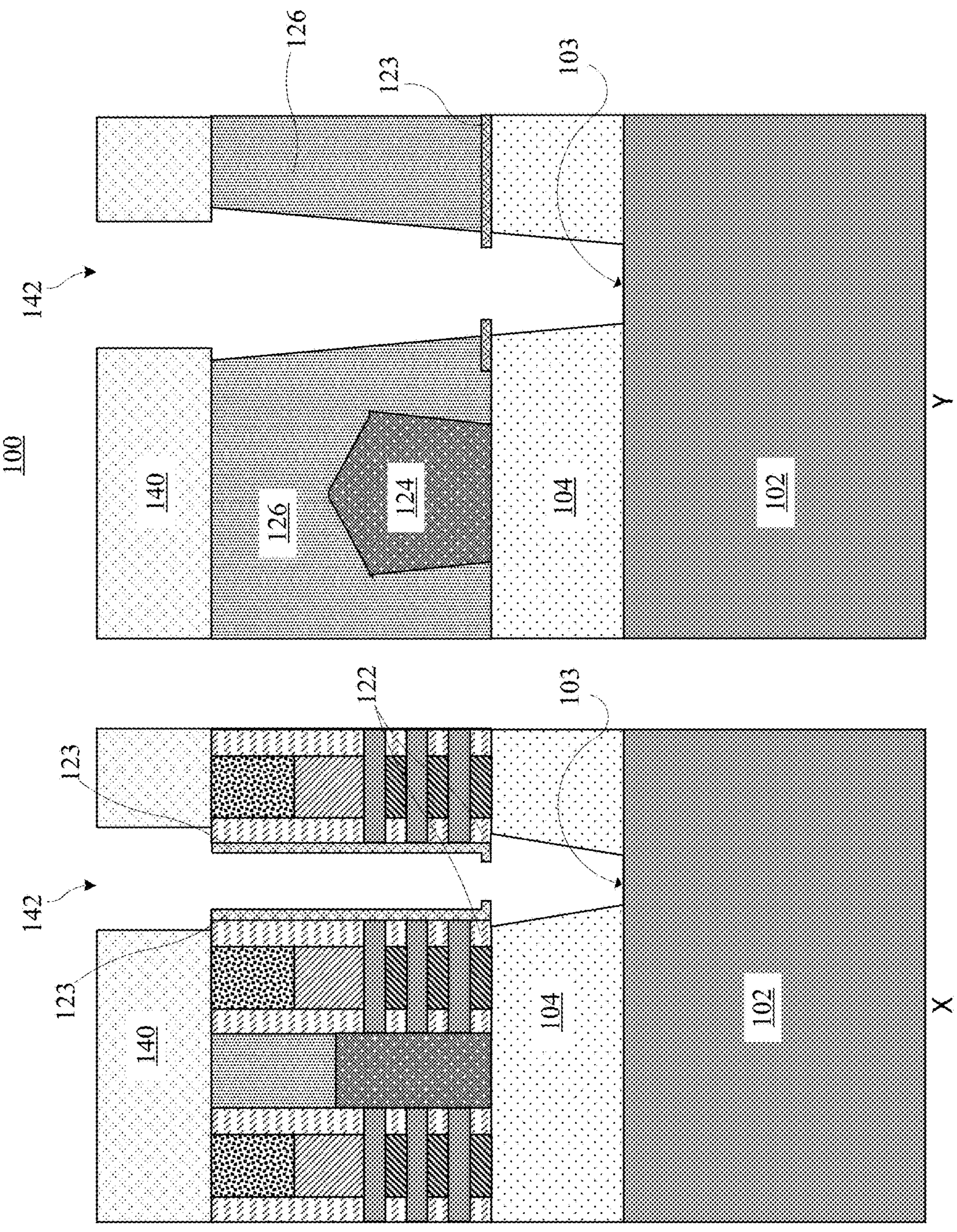

Referring now to FIG. 7, this figure depicts cross-sectional views of the semiconductor device 100 after additional fabrication operations where backside S/D trench 142 is laterally enlarged and may effectively remove the portions of ILD 126 that are upon the vertical sidewall(s) of liner 123. The etching technique may remove the material of ILD 126 and remove the material of insulator layer 104 and may be selective to the material of liner 123. Therefore, portions of the ILD 126 and portions insulator layer 104 may generally be horizontally removed (e.g., backside S/D trench 142 is widened, etc.) thereby creating an undercut below mask 140 and above and below liner 123. This lateral etching processes can have etching parameters that can be tuned to control the relative width of the portion of backside S/D trench 142 that is formed by the insulator layer 104. In examples, the width of this portion of backside S/D trench 142 may be so controlled such that a portion of respective bottom surfaces of neighboring inner spacers 122 may be exposed to adequately distance the gates of the associated neighboring FETs from the backside S/D trench 142.

Figure 8:
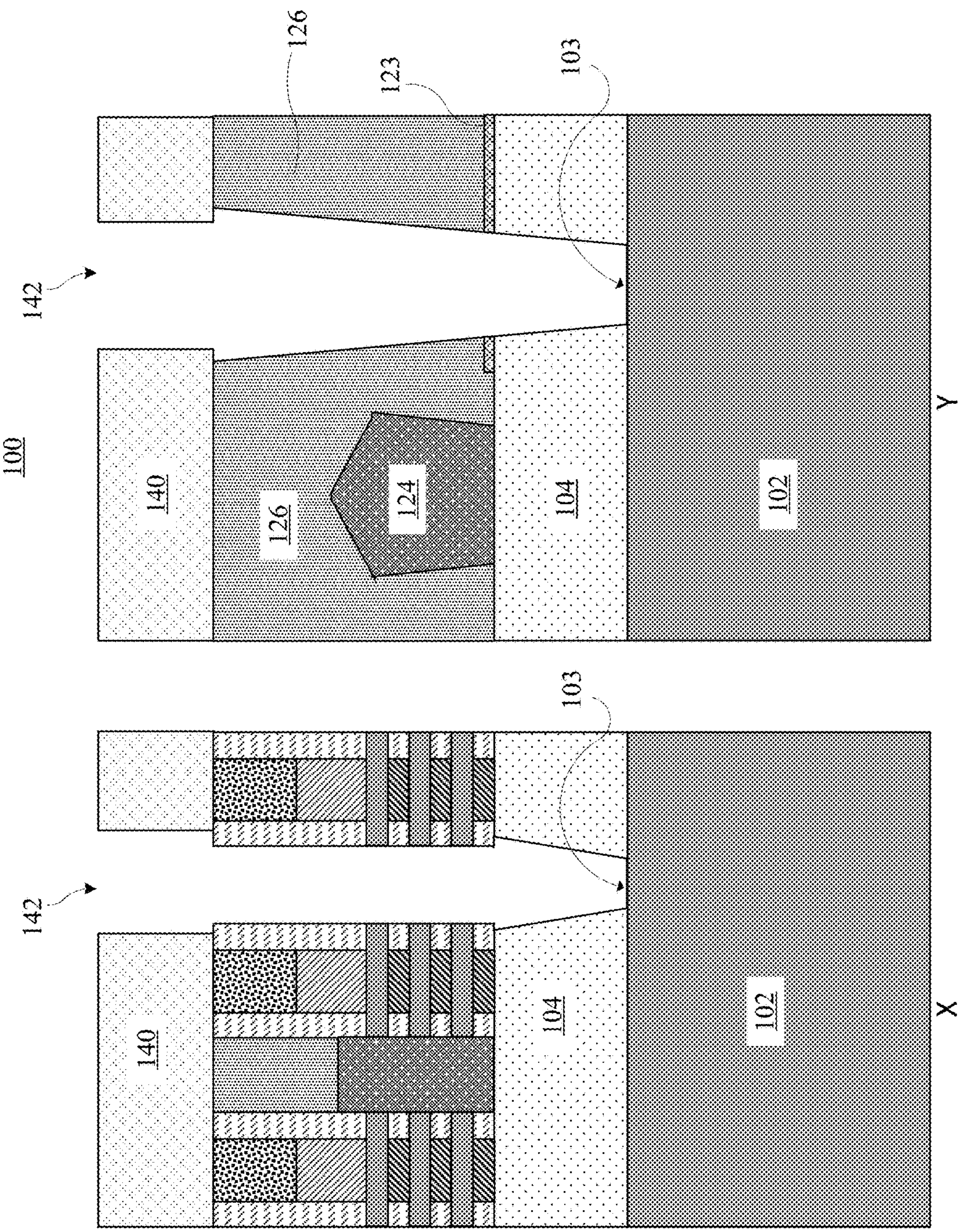

Referring now to FIG. 8, this figure is a cross-sectional view of semiconductor device 100 after additional fabrication operations where the vertical portions of liner 123 within the backside S/D trench 142 are removed while horizontal portions of liner 123 that are between the insulator layer 104 and ILD 126 are retained. The vertical portions of liner 123 within the backside S/D trench 142 may be removed by any suitable material removal process known to one of skill in the art. For example, such removal may be accomplished by an etching process which may include a dry etching process such as, for example, reactive ion etching, plasma etching, ion etching or laser ablation. The etching can further include a wet chemical etching process in which one or more chemical etchants are used to remove the vertical portions of liner 123 within the backside S/D trench 142.

Figure 9:
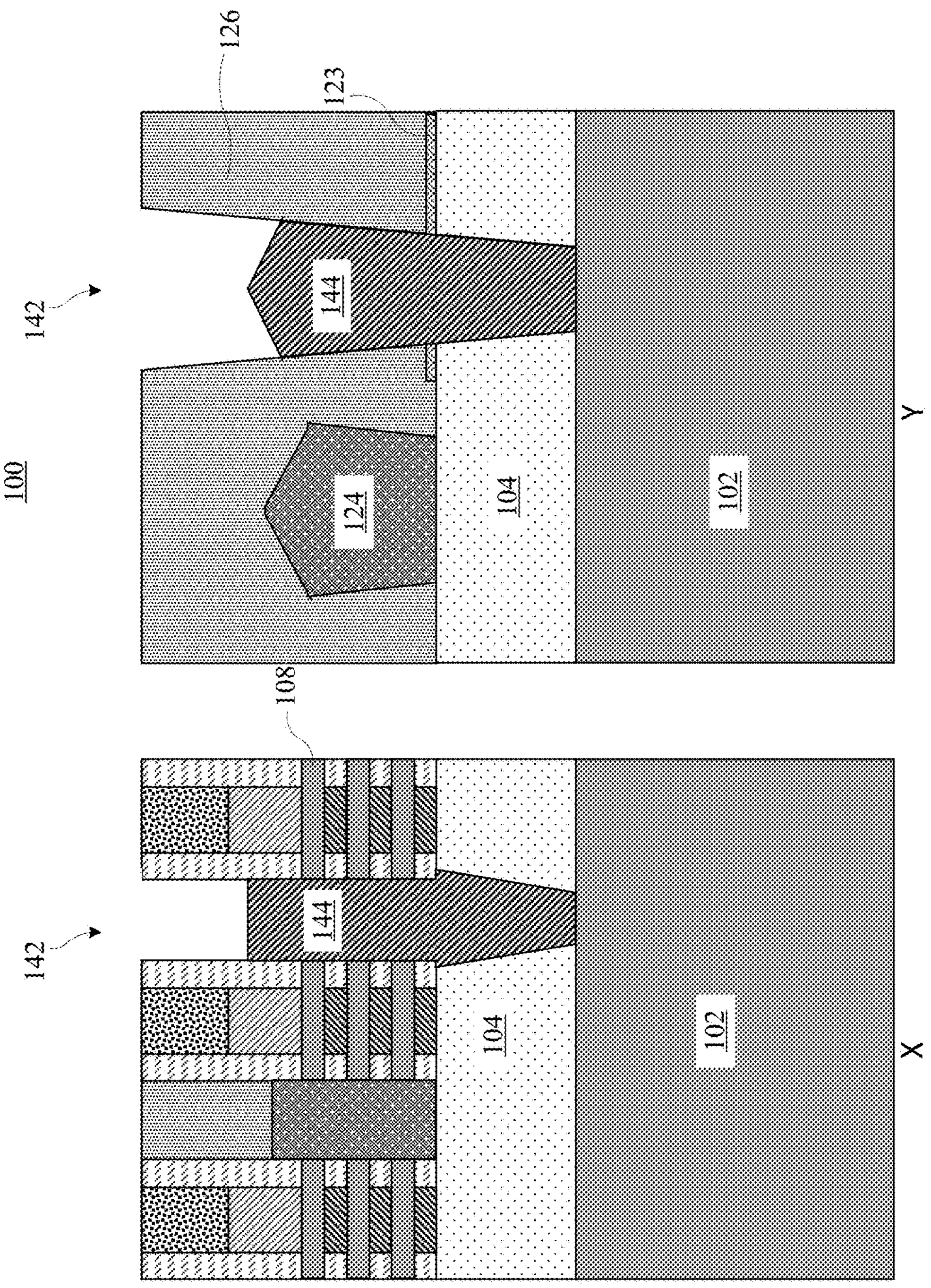

Referring now to FIG. 9, this figure depicts cross-sectional views of the semiconductor device 100 after additional fabrication operations where S/D region 144 is formed within backside S/D trench 142. The S/D region 144 forms either a source or a drain, respectively, to each neighboring nanostructure stacks. The S/D region 144 may be formed by epitaxially growing a source/drain epitaxial region within the backside S/D trench 142. In some examples, S/D region 144 is formed by in-situ doped epitaxial growth. In some examples, the S/D region 144 epitaxial growth may overgrow above the upper surface of the second S/D region 124. The S/D region 144 may be the same material relative to the second S/D region 124. Alternatively, the S/D region 144 may be a different material (e.g., different material entirely, different atomic weight of an element of the same material, or the like) relative to the second S/D region 124. In some examples, S/D region 144 may be epitaxially grown from the top surface 113 of substrate 102 that is exposed by backside S/D trench 142. As such, a bottom surface of S/D region 144 is generally below a bottom surface of the S/D regions 124.

In certain implementations, the S/D region 144 may be partially recessed such that an upper portion of the S/D region 144 is removed. For example, the upper portion S/D regions 144 may be etched or otherwise removed. The etch may be timed or otherwise controlled to stop the removal of the S/D region 144 such that the top surface of the S/D region 144 is below the upper surface of the S/D region 124. Alternatively, as depicted, the etch may be timed or otherwise controlled to stop the removal of the S/D region 144 such that the top surface of the S/D region 144 is above the upper surface of the S/D region 124. In these examples, the top surface of S/D region 144 may still be above the upper surface of the topmost active semiconductor layer 108.

For clarity, as shown in the Y cross-section, S/D region 144 may be between a first portion of liner 123 and a second portion of liner 123. The first portion of liner 123 and the second portion of liner 123 may both be located directly upon the top surface of insulator layer 104.

In examples, as depicted in the Y cross-section, a top portion of S/D region 144 near the top surface of S/D region 144 may have a relatively larger diameter or horizontal dimension relative to the diameter or horizontal dimension of S/D region 144 of a bottom portion of S/D region 144 near the bottom surface of S/D region 144.

Figure 10:
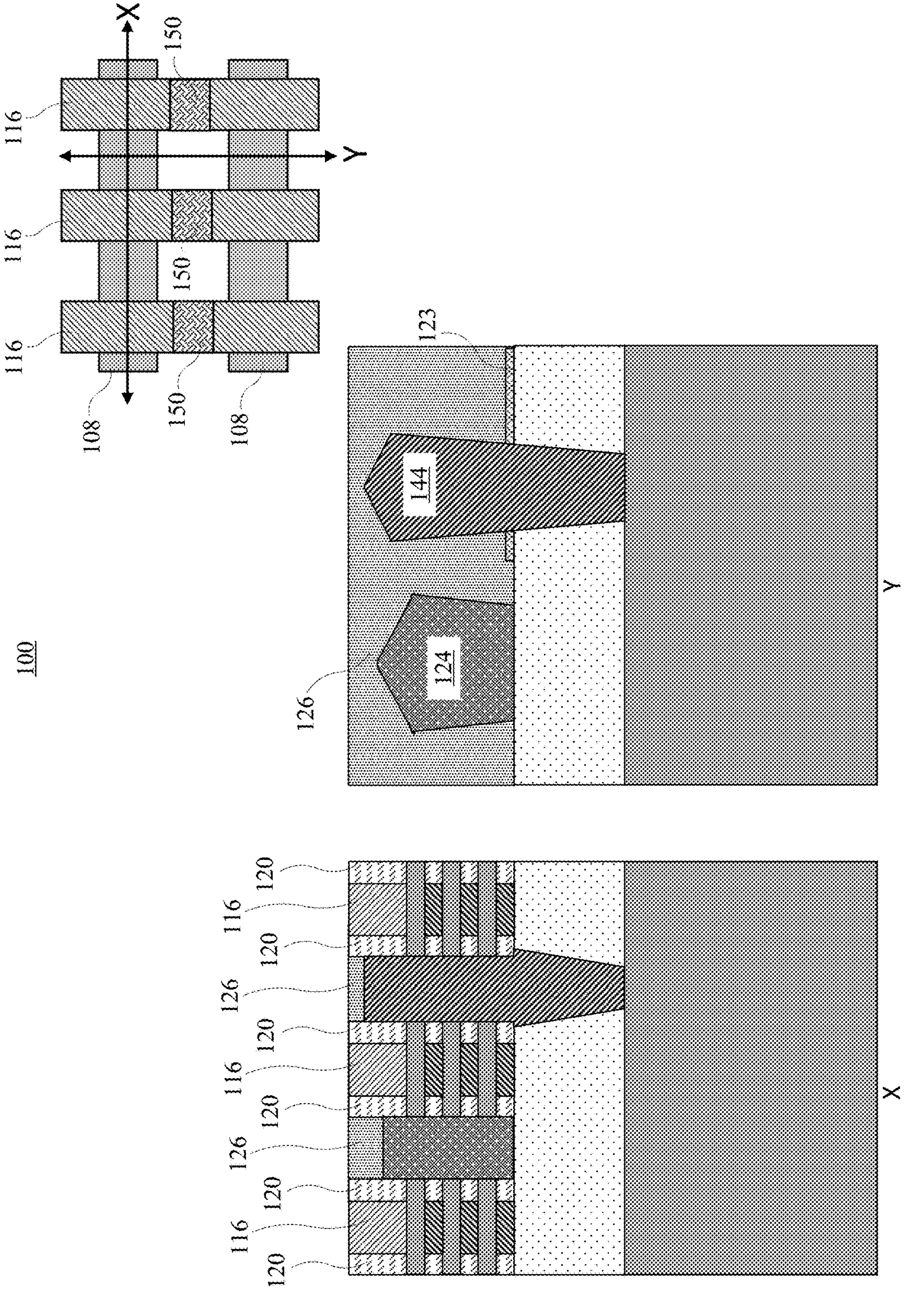
FIG. 10 and FIG. 11 depict partial top-down views and cross-sectional views, respectively, of a semiconductor device that includes a backside S/D at intermediate stages of the fabrication process, according to embodiments.

Referring now to FIG. 10, this figure depicts top-down and cross-sectional views of the semiconductor device 100 after additional fabrication operations where ILD 126 is formed within the remaining backside S/D trench 142, gate hardmask 118 is removed, and gate cut 150 region is formed within the sacrificial gates 116, respectively.

The ILD 126 may be formed within the remaining backside S/D trench 142, generally filling the backside S/D trench 142. The ILD 126 may be formed by depositing a dielectric material, such as, for example, porous silicates, carbon doped oxides, silicon dioxides, silicon nitrides, silicon oxynitrides, or other dielectric materials. Any known manner of forming the ILD 126 can be utilized. The ILD 126 can be formed using, for example, CVD, PECVD, ALD, flowable CVD, spin-on dielectrics, or PVD.

Gate hardmask 118 may be removed by a planarization process, such as a CMP, that to results in a planar upper surface for the semiconductor device 100. For example, after the planarization process, the top surfaces of spacers 120, the top surfaces of sacrificial gates 116, and the top surface of ILD 126 may be coplanar.

Gate cut 150 regions physically and at least partially electrically separates the gate structure (e.g., electrically and physical separates the applicable single gate into two electrically distinct gates). Initially, gate cut 150 regions may be formed by forming a gate cut trench by removing portion(s) of sacrificial gates 116, gate spacers 120, within the location of the gate cut region stopping at the top surface of isolation layer 104 or substrate 102. The undesired portions of these applicable material(s) may be removed removal techniques such as e.g., depositing and patterning a gate cut mask, lithography, etching, or the like.

Subsequently, gate cut 150 region is formed within the gate cut trench. Gate cut 150 region may be a dielectric material, such as, for example, porous silicates, carbon doped oxides, silicon dioxides, silicon nitrides, silicon oxynitrides, or other dielectric materials. In an example, gate cut 150 region may be connected to and separate a first gate of a p-type FET from a second gate of a n-type FET. In another example, gate cut 150 region may be connected to and separate a first gate of a p-type FET from a second gate of a p-type FET. In another example, gate cut 150 region may be connected to and separate a first gate of a n-type FET from a second gate of a n-type FET.

Figure 11:
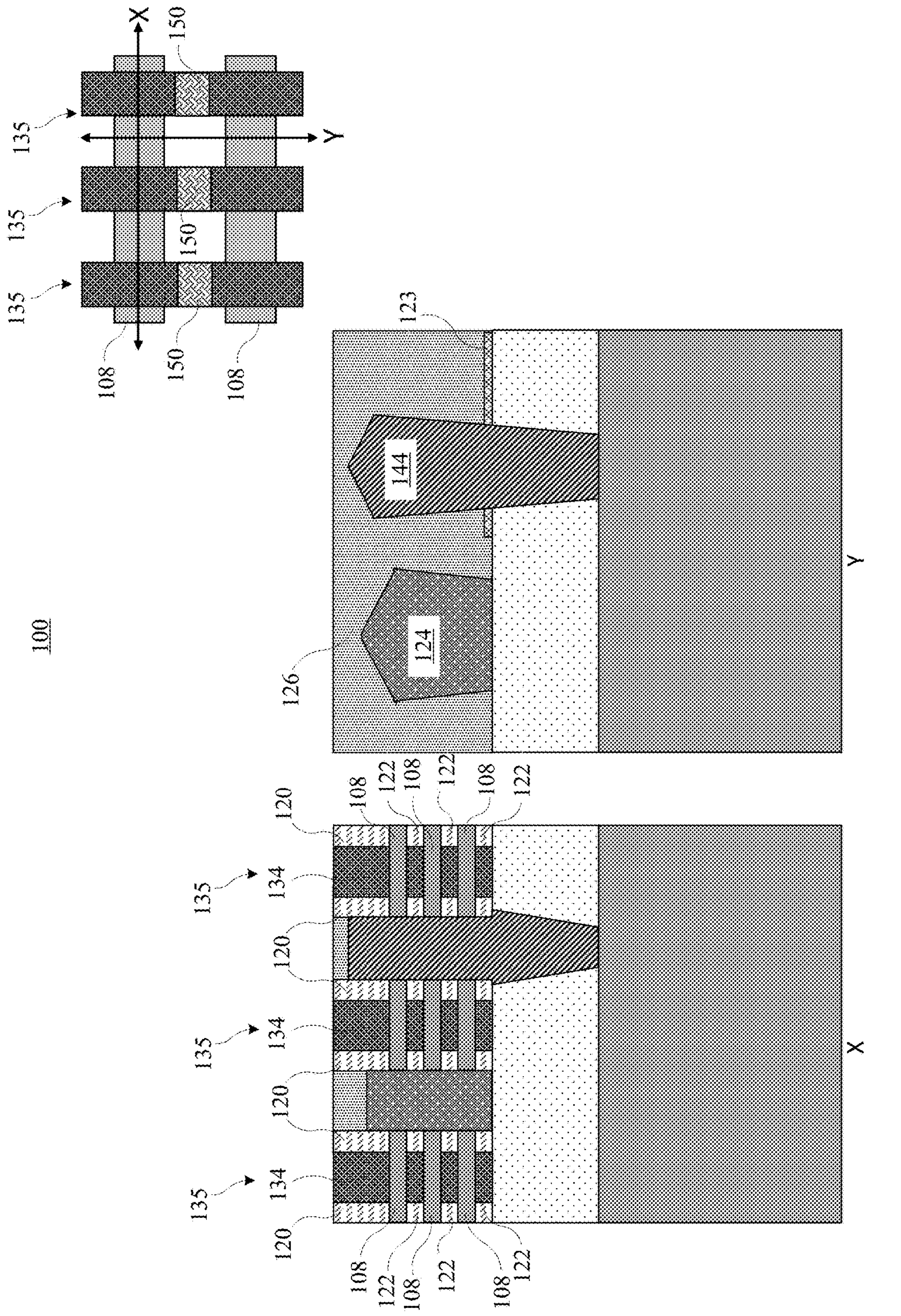

Referring now to FIG. 11, this figure is a cross-sectional view of semiconductor device 100 after additional fabrication operations where the sacrificial gate 116 is removed, the sacrificial oxide layer is removed, the sacrificial layers 106 are removed, and replacement gate structure 135 is formed in place thereof.

The sacrificial gate 116 is removed by any suitable material removal process known to one of skill in the art. For example, such removal may be accomplished by an etching process which may include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. Then, the sacrificial layers 106 are removed (or released). Thus, there are void spaces between the active semiconductor layers 108 due to the removal of the sacrificial layers 106. It should be appreciated that during the removal of the sacrificial gate 116, the sacrificial oxide layer, and the sacrificial layers 106, appropriate etchants are used that do not significantly remove material of active semiconductor layers 108. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Replacement gate structure 135 may be formed by initially forming an interfacial layer (not shown) on the interior surfaces of the spacer 120 and the interior surfaces of the active semiconductor layers 108 and the inner spacers 122. Then, a high-K layer (not shown) is formed to cover the surfaces of exposed surfaces of the interfacial layer 130. The high-K layer can be deposited by any suitable techniques, such as ALD, CVD, metal-organic CVD (MOCVD), physical vapor deposition (PVD), thermal oxidation, combinations thereof, or other suitable techniques. A high-K dielectric material is a material with a higher dielectric constant than that of $SiO_2$, and can include e.g., LaO, AlO, ZrO, TiO, $Ta_2O_5$, $Y_2O_3$, $SrTiO_3$(STO), $BaTiO_3$(BTO), BaZrO, HfZrO, HfLaO, HfSiO, LaSiO, AlSiO, HfTaO, HfSiO, (Ba,Sr)$TiO_3$ (BST), $Al_2O_3$, $Si_3N_4$, oxynitrides (SiON), or other suitable materials. The high-κ layer can include a single layer or multiple layers, such as metal layer, liner layer, wetting layer, and adhesion layer. In other embodiments, the high-K layer can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure 135 may be further formed by depositing a work function metal (WFM) gate 134 (or replacement gate). The WFM gate 134 can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the WFM gate 134 can be reduced by chemical-mechanical polishing (CMP) and/or etching. Therefore, the planarization process can be provided by CMP. Other planarization process can include grinding and polishing. In general, the work function metal (WFM) gate 134 sets the threshold voltage (Vt) of the device, a high-K gate dielectric material separating the WFM gate 134 from the nanostructure channel (i.e., active semiconductor layers 108), and other metals that may be desired to further fine tune the effective work function (eWF) and/or to achieve a desired resistance value associated with current flow through the gate stack in the direction parallel to the plane of the nanostructure channel.

Figure 12:
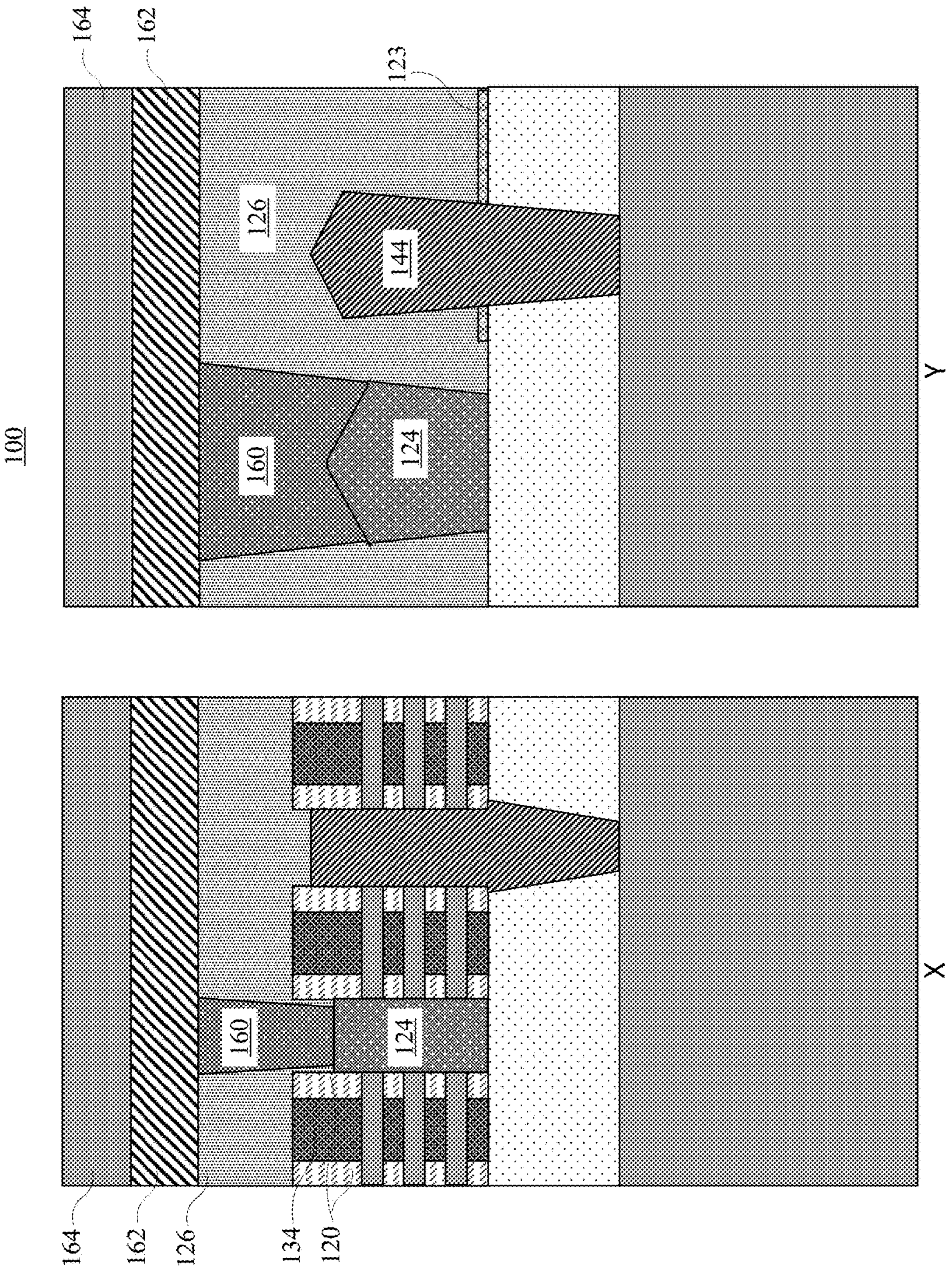
FIG. 12 through FIG. 16 depicts cross-sectional views of a semiconductor device that includes a backside S/D at intermediate stages of the fabrication process, according to embodiments.

Referring now to FIG. 12, this figure is a cross-sectional view of semiconductor device 100 after additional fabrication operations, where ILD 126 is formed (e.g., thickened, etc.), S/D contact 160 is formed, BEOL structure(s) 162 are formed, and a carrier wafer 164 is attached.

The ILD 126 may be formed upon the top surface of the semiconductor device 100, as depicted in FIG. 11. The ILD 126 may be formed by depositing a dielectric material, such as, for example, porous silicates, carbon doped oxides, silicon dioxides, silicon nitrides, silicon oxynitrides, or other dielectric materials. Any known manner of forming the ILD 126 can be utilized. The ILD 126 can be formed using, for example, CVD, PECVD, ALD, flowable CVD, spin-on dielectrics, or PVD.

Subsequently, S/D contact 160 is formed by forming a S/D contact trench within ILD 126 and depositing conductive material within the S/D contact trench over a first S/D region 124. S/D contact 160 may consist of a silicide liner, such as Ni, NiPt or Ti, etc, a metal adhesion liner, such as TiN, TaN, etc., and a conductive metal fill, such as Al, Ru, W, Co, Cu, etc. The formation of S/D contact 160 may include etching the ILD 126 to form via openings, deposition of material(s), and performing a planarization process, such as a CMP process or a mechanical grinding process, to remove excess portions of the conductive barrier layer and the conductive material. Subsequently, the top surface of S/D contact 160 and the top surface of ILD 126 may be coplanar. S/D contact 160 may be formed during middle of the line (MOL) processes.

BEOL structure(s) 162 include metallization levels, associated metallization dielectric layers, VIAs that connect the metallization feature(s) within the metallization levels with an underlying device or structure, and/or conductive bonding pads, or the like. BEOL structure(s) 162 include at least a conductive wire, conductive trace, conductive plane, or the like, that is formed over S/D contact 160 making electrical contact therewith. In some examples, there may be 5 metal levels $M_0$-$M_4$ within BEOL structure(s) 162. In some examples, there may be more than 10 metal levels $M_0$-$M_x$ within BEOL structure(s) 162. In some examples, S/D contact 160 may contact and connect the source or drain (i.e., S/D region 124) of the first FET to a trace, power plane, or the like located within the lowest metal level $M_0$.

Upon completion of BEOL structure(s) 162, carrier wafer 164 may be bonded or otherwise attached to the top surface or front side of BEOL structure(s) 162, as depicted. Carrier wafer 164 may be attached to semiconductor device 100 by any carrier bonding technique.

For clarity, semiconductor device 100 may undergo similar processes, utilized to fabricate S/D contact 160, to form a gate contact, such that the gate contact may contact and extend vertically upward from WFM gate 134 and may connect with a wiring feature within metal levels $M_0$-$M_x$ within BEOL structure(s) 162.

Figure 13:
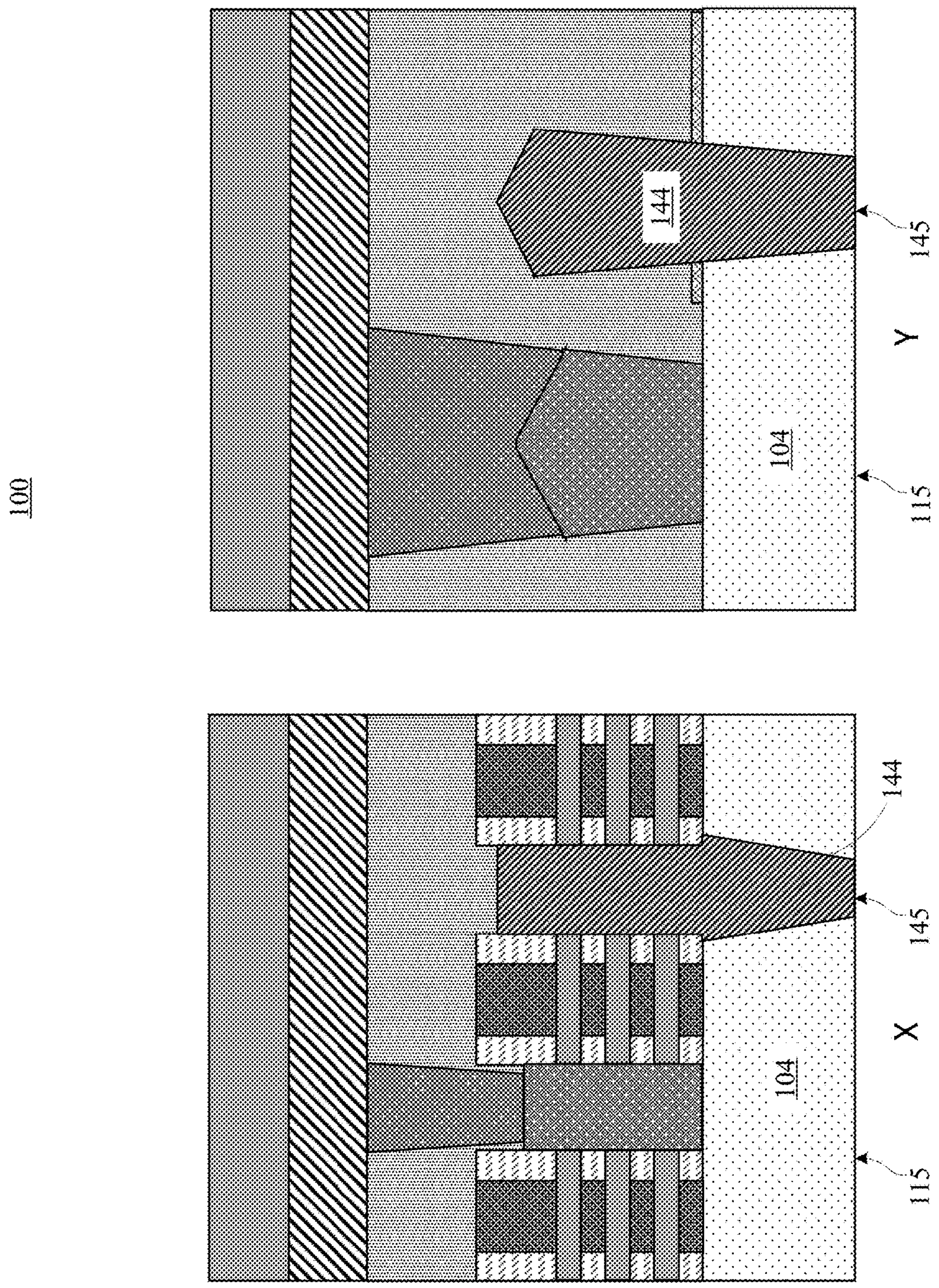

Referring now to FIG. 13, this figure is a cross-sectional view of semiconductor device 100 after additional fabrication operations where the wafer is flipped for backside processing, and then substrate 102 is removed. The substrate 102 may be removed by any removal technique, such as a combination of wafer grinding, CMP, dry and wet etch.

Removal of substrate 102 exposes the bottom surface 115 of insulator layer 104 and a bottom surface 145 of S/D region 144.

Figure 14:
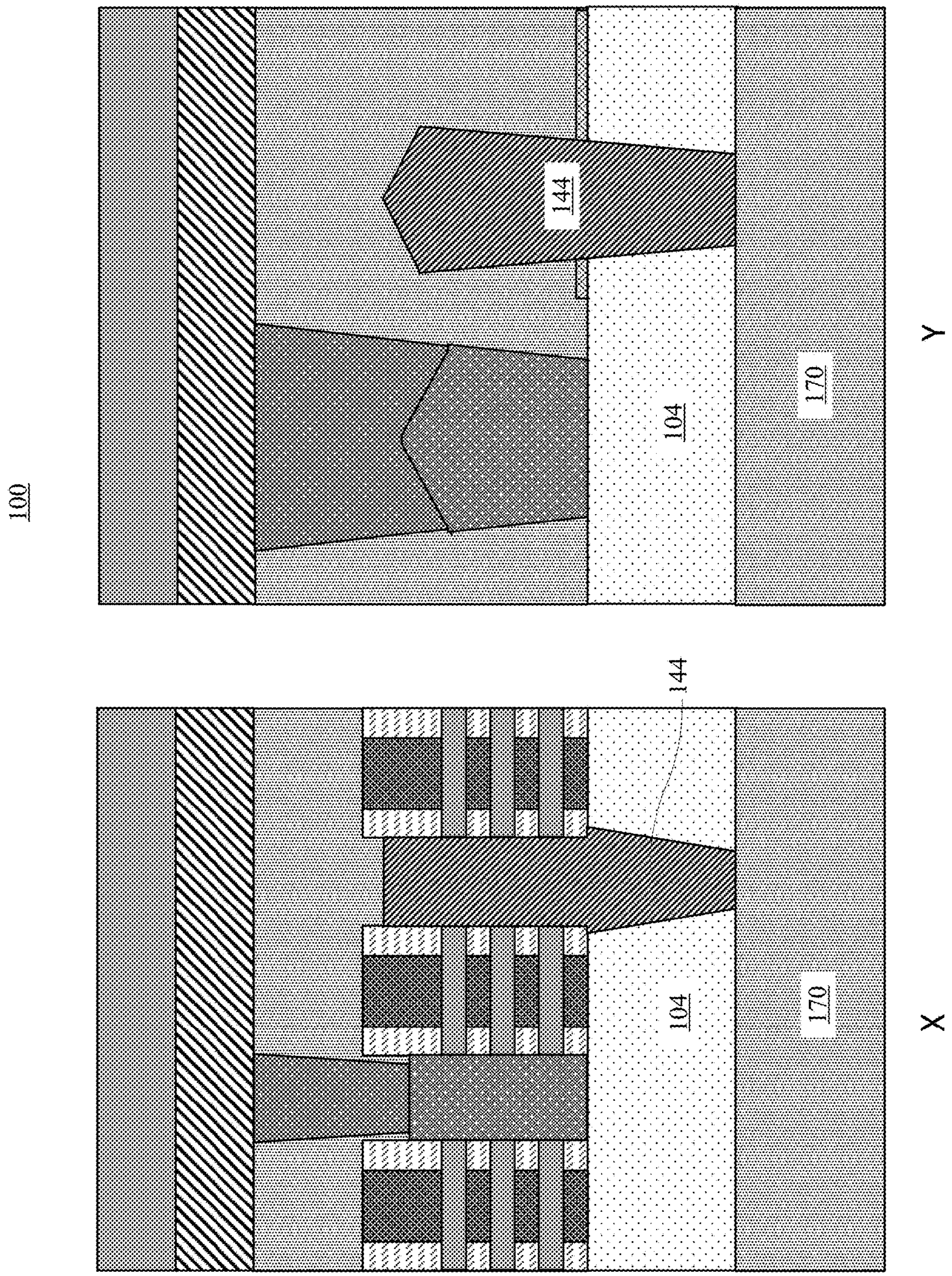

Referring now to FIG. 14, this figure is a cross-sectional view of semiconductor device 100 after additional fabrication operations, where ILD 170 is formed upon the exposed bottom surface 115 of insulator layer 104 and upon the exposed bottom surface 145 of S/D region 144.

The ILD 170 may be formed by depositing a dielectric material, upon insulator layer 104 and upon S/D region 144. The ILD 170 can be any suitable material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

Figure 15:
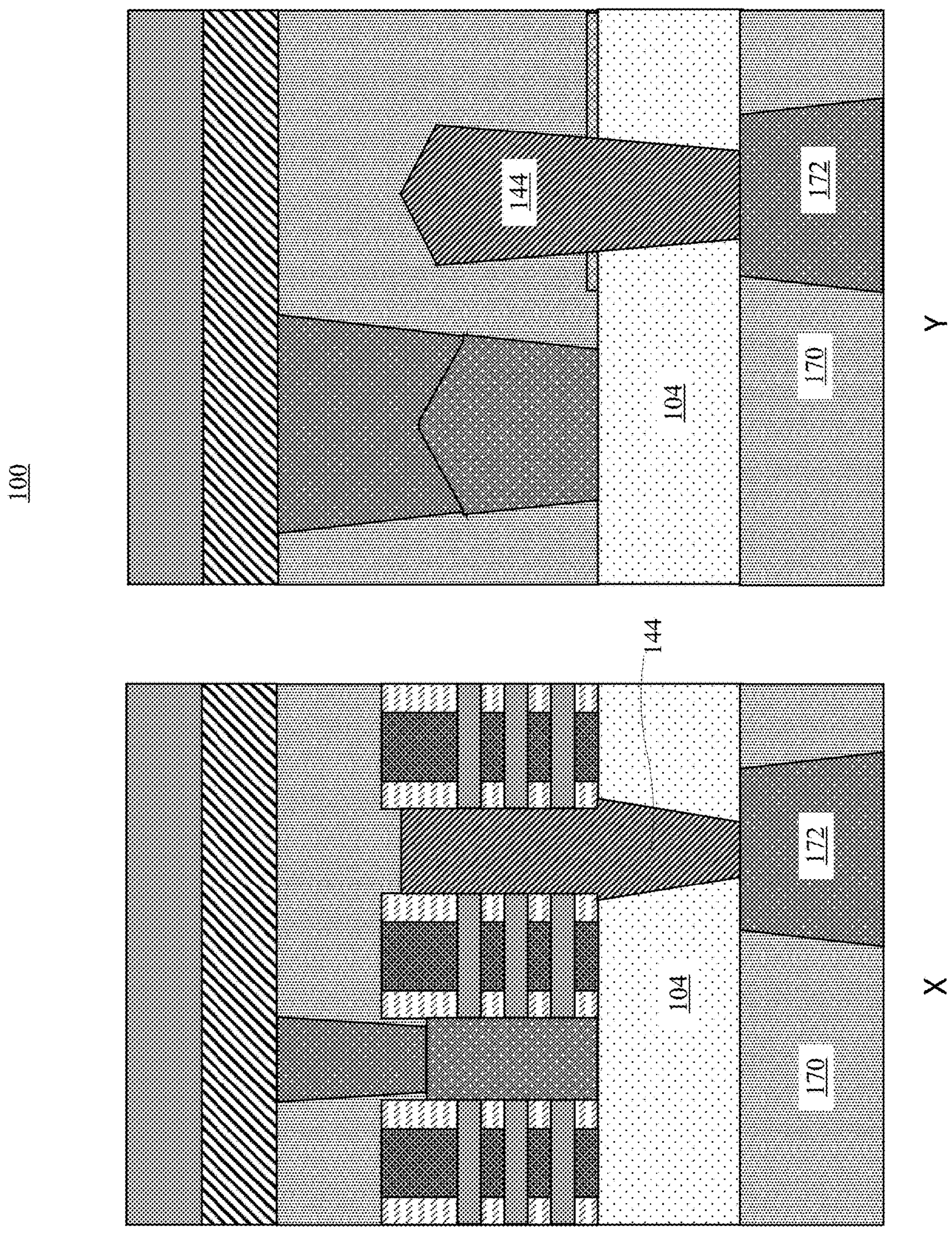

Referring now to FIG. 15, this figure is a cross-sectional view of semiconductor device 100 after additional fabrication operations, where S/D contact 172 is formed. Backside S/D contact 172 is formed by forming a S/D contact trench within ILD 170 and depositing conductive material within the S/D contact trench over a S/D region 144. The S/D contact trench may expose the entire bottom surface 145 of S/D region 144. The S/D contact trench may expose a portion of the bottom surface 115 of insulator layer 104 that immediately surrounds the S/D region 144 (e.g., insulator layer 104 is used as an etch stop, etc.). S/D contact 172 may directly contact at least the exposed bottom surface 145 of S/D region 144. Further, S/D contact 172 may directly contact both the exposed bottom surface 145 of S/D region 144 and the exposed portion of the bottom surface 115 of insulator layer 104 that immediately surrounds the S/D region 144.

The backside S/D contact 172 may consist of a silicide liner, such as Ni, NiPt or Ti, etc, a metal adhesion liner, such as TiN, TaN, etc., and a conductive metal fill, such as Al, Ru, W, Co, Cu, etc. In some examples, S/D contact 172 may be a contact feature, such as a vertical interconnect access (VIA) to a backside rail 180, shown in FIG. 16, such as a backside wiring line, backside power plane, or the like. The formation of the backside S/D contact 172 may include etching the ILD 170 to form via openings, forming a blanket conductive barrier layer extending into the via openings, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of S/D contact 172 and the bottom surface of ILD 170 may be coplanar.

In some examples, the thickness of ILD 170 may be chosen to achieve a predetermined adequate dimension between the top surface of S/D contact 172 and WFM gates 134 to prevent or substantially prevent electrical shorting therebetween.

Figure 16:
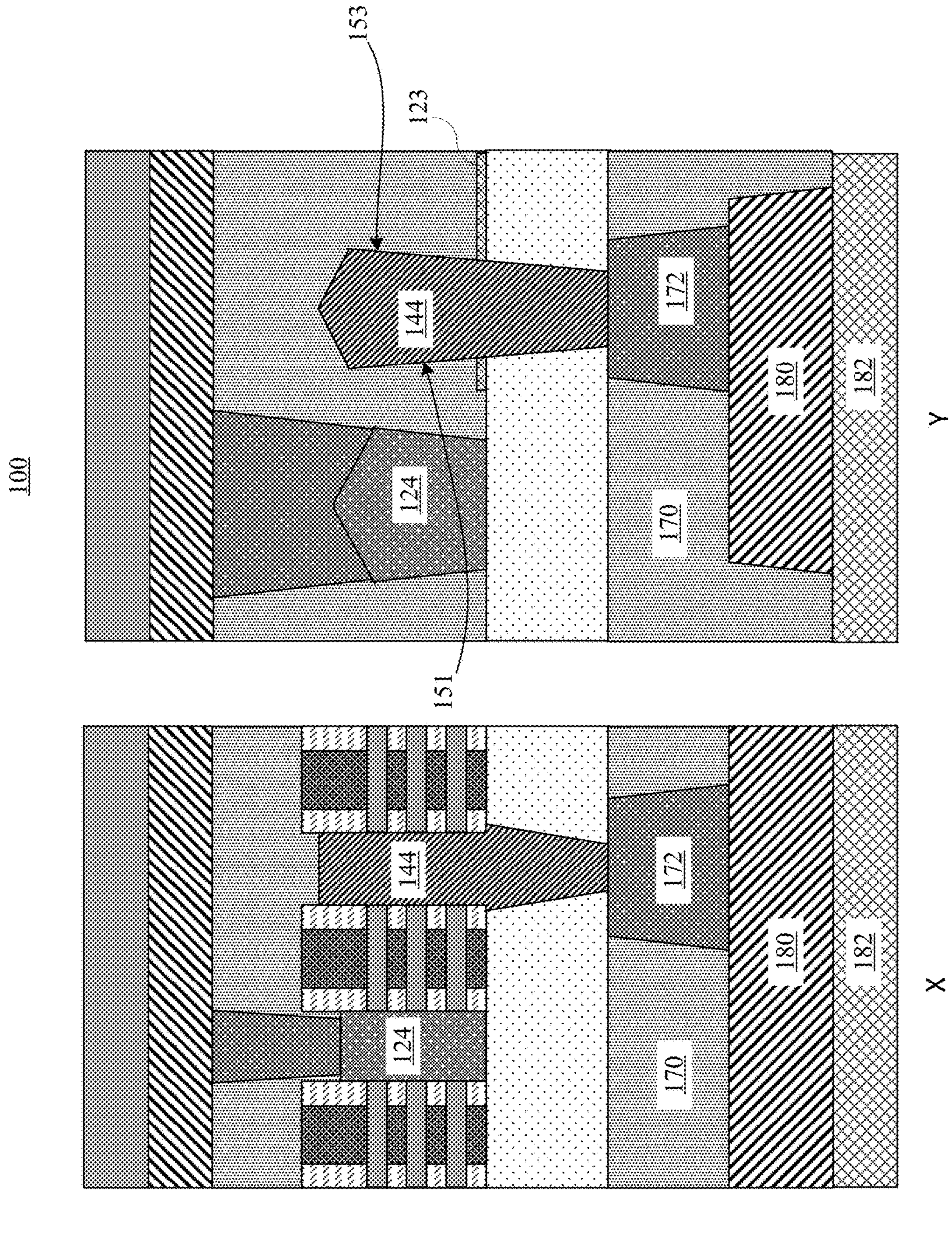

Referring now to FIG. 16, this figure is a cross-sectional view of semiconductor device 100 after additional fabrication operations, where ILD 170 is formed (e.g., thickened, etc.), backside power rail 180 is formed, and backside power distribution network (BSPDN) 182 is formed.

The ILD 170 may be formed upon the bottom surface of the semiconductor device 100, as depicted in FIG. 15. The ILD 170 may be formed by depositing a dielectric material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

Subsequently, backside rail 180 is formed by forming a backside rail trench within ILD 170 and depositing conductive material within the backside rail trench over S/D contact 172. The backside rail trench may expose the entire bottom surface of S/D contact 172 and may further create a surface of ILD 170 that is coplanar with or substantially coplanar with the bottom surface of S/D contact 172. Backside rail 180 may directly contact at least the exposed bottom surface of S/D contact 172.

Backside rail 180 may consist of a metal, such as copper, aluminum, tungsten, cobalt, metal alloys thereof, or the like. In some examples, backside rail 180 may be a power plane (e.g., VDD power plane, VSS power plane, etc.). Backside rail 180 may include a conductive region and a conductive barrier layer(s) between the sidewalls and upper surfaces of the conductive regions and the ILD 170. The conductive barrier layer(s) may be formed of titanium, titanium nitride, tantalum, tantalum nitride, cobalt, a combination thereof, or the like. The conductive regions may be formed of metals such as copper, aluminum, tungsten, cobalt, alloys thereof, or the like. The formation of backside rail 180 may include etching the ILD 170 to form a power plane opening, forming a blanket conductive barrier layer extending into the power plane opening, depositing a metallic or conductive material over the blanket conductive barrier layer, and performing a planarization process, such as a CMP process or a mechanical grinding process, to remove excess portions of the conductive barrier layer and the conductive material. Subsequently, the bottom surface of backside rail 180 and the bottom surface of ILD 170 may be coplanar. BSPDN 182 includes known power distribution network features and/or structures to adequately provide power to backside rail 180.

For clarity, as depicted, semiconductor device 100 may include a FET with a first S/D region 124 and associated S/D contact 160 upon a top surface of the first S/D region 124. The S/D contact 160 is electrically connected to a BEOL wiring feature generally above the FET. The FET may further include a second S/D region 144 and associated S/D contact 172 upon a bottom surface of the associated S/D region 144. The S/D contact 172 is electrically connected to a backside rail 180 generally below the FET. Semiconductor device 100 may further include a liner 123 upon the insulator layer 104. The backside S/D trench 142 may effectively form an opening within the substantially horizontal portion of liner 123 thereby breaking such portion of the liner 123 into a front portion in contact with a front side 151 of the S/D region 144 and a rear portion in contact with an opposing rear side 153 of the S/D region 144.

Figure 17:
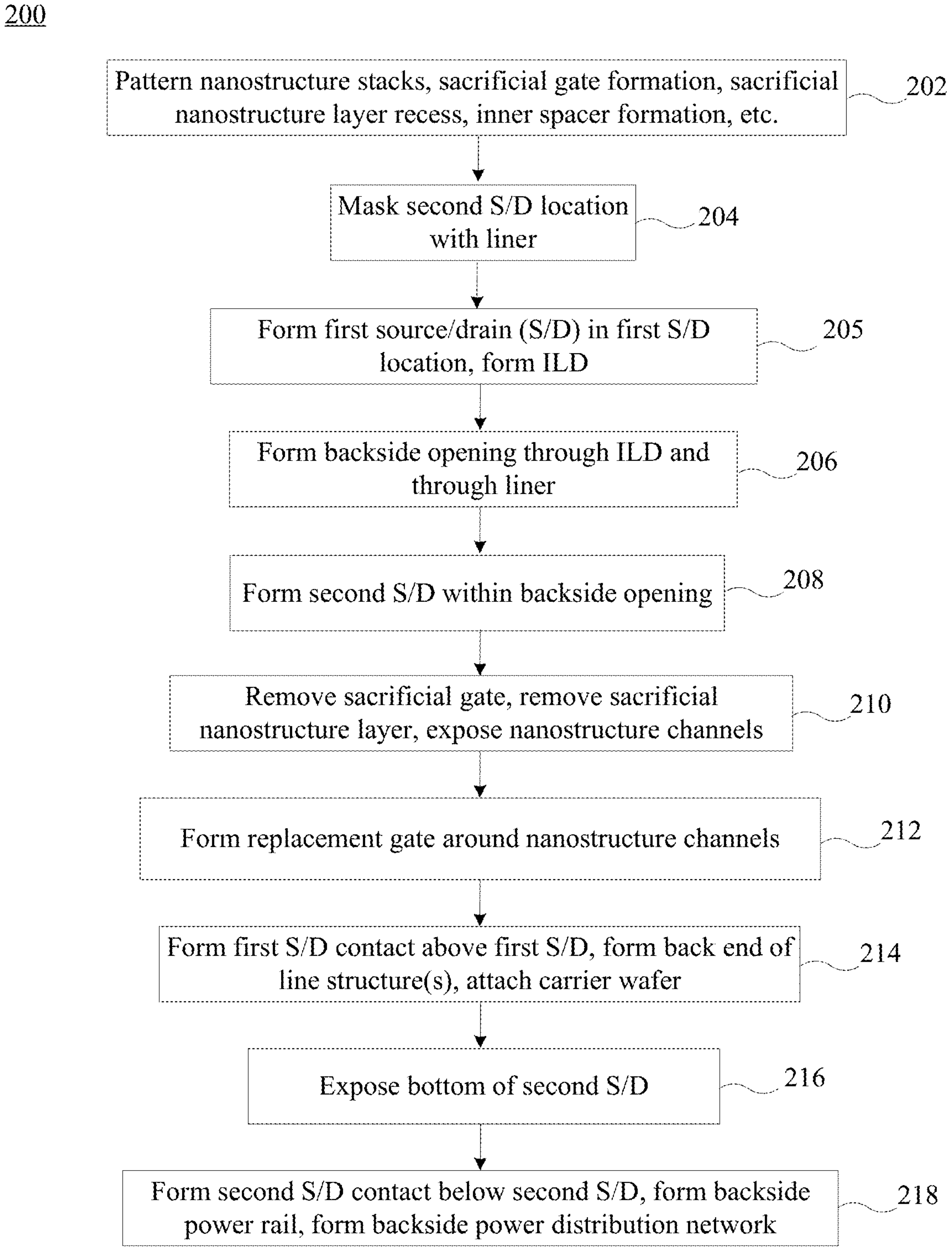
FIG. 17 depicts a process of fabricating a semiconductor device that includes a backside S/D, according to embodiments.

FIG. 17 depicts a process 200 of fabricating semiconductor device 100 that includes a backside S/D region 144, according to embodiments. Process 200 begins at block 202 with patterning a nanostructure stack, forming a sacrificial gate structure around the nanostructure stack, forming a gate spacer around the sacrificial gate structure, directionally recessing the sacrificial nanostructure layers of the nanostructure stack that are under the gate spacer, and forming inner spacers within the recesses formed by the directional spacing. The fabrication operations of block 202 may result in semiconductor device 100 that includes features or structures as depicted in FIG. 1.

At block 204, at least a second S/D location is masked by a liner. For example, second S/D location 105 is masked by liner 123. Liner 123 may be formed upon the top surface of insulator layer 104 that masks surfaces that which a S/D region may be grown therefrom. For example, in the second S/D location 105, substantially vertical portions of liner 123 are formed upon respective facing sidewalls of neighboring FET structures and the substantially horizontal portion of liner 123 is formed upon top surface of insulator layer 104. The fabrication operations of block 204 may result in semiconductor device 100 that includes features or structures as depicted in FIGS. 2-4.

At block 205, a first S/D region is formed on a first side of the nanostructure stack within a first S/D location while the liner blocks formation of an associated S/D region within the second S/D location. For example, a first S/D region 124 is formed within the first S/D location 103 and a second S/D region 124 is formed within a third S/D location 107, while another instance of S/D region 124 is blocked from being formed within the second S/D location 105 by liner 123. The S/D region 124 may contact respective first end surfaces of the active semiconductor layers 108 of the nanostructure stack. Subsequently, the mask 133 used to pattern liner 123 may be removed and the patterned liner 123 may be retained and, in some examples, ILD 126 may be formed upon the S/D region(s) 124 and upon the liner 123. The fabrication operations of block 205 may result in semiconductor device 100 that includes features or structures as depicted in FIG. 4.

At block 206, a backside opening is formed through a portion of the ILD that is over the liner and a portion of the liner within the second S/D location. For example, backside S/D trench 142 is formed from a top surface of the semiconductor device 100 (i.e., frontside) through ILD 126, through a portion of liner 123, and through a portion insulator layer 104. The backside S/D trench 142 may expose a portion of the top surface 113 of substrate 102. In some examples, the backside S/D trench 142 is further processed (e.g., widened, the substantially vertical portions of liner 123 may be removed, while the substantially horizontal portion of liner 123 may be retained, or the like). The fabrication operations of block 206 may result in semiconductor device 100 that includes features or structures as depicted in FIGS. 6-8.

At block 208, a second S/D region is formed within the backside opening within the second S/D location. For example, S/D region 144 is formed within backside S/D trench 142 within S/D location 105. The S/D region 144 may contact respective second end surfaces of the active semiconductor layers 108 of the nanostructure stack that oppose the associated respective first end surfaces. In some examples, ILD 126 may be formed upon the S/D region 144. The fabrication operations of block 208 may result in semiconductor device 100 that includes features or structures as depicted in FIG. 9.

At block 210, the sacrificial gate structure is removed, the sacrificial nanostructure layers within the nanostructure stack are removed, and the active semiconductor layers (i.e., the nanostructure channels) are exposed. For example, sacrificial gate 116 is removed, sacrificial layers 106 are removed, and active semiconductor layers 108 are exposed. At block 212, a replacement gate structure is formed around the nanostructure channels. For example, WMF gate 134 is formed around the exposed active semiconductor layers 108. The fabrication operations of blocks 210 and 212 may result in semiconductor device 100 that includes features or structures as depicted in FIG. 10.

At block 214, a first S/D contact is formed above or over the first S/D region, BEOL structures are formed over the first S/D contact, and a carrier wafer is attached to the top surface or front side of the semiconductor device 100. For example, S/D contact 160 is formed upon and contacts the top surface of the first S/D region 124. BEOL structures 162 are formed over the S/D contact 160, and carrier wafer 164 is attached. The fabrication operations of block 214 may result in semiconductor device 100 that includes features or structures as depicted in FIG. 11.

At block 216, at least the bottom surface of the second S/D region is exposed from the backside. For example, substrate 102 may be removed and replaced with ILD 170. A backside S/D contact trench may be formed within ILD 170 that exposes at least the bottom surface of S/D region 144. The fabrication operations of block 216 may result in semiconductor device 100 that includes features or structures as depicted in FIGS. 13-15.

At block 218, a second S/D contact is formed below the second S/D region, a backside power rail is formed below the second S/D contact, and/or a BSPSN is formed below the backside power rail. For example, S/D contact 172 may be formed within the backside S/D contact trench, backside rail 180 may be formed below the S/D contact 172, and BSPDN 182 may be formed below the backside rail 180. The fabrication operations of block 218 may result in semiconductor device 100 that includes features or structures as depicted in FIG. 16.

Figure 18:
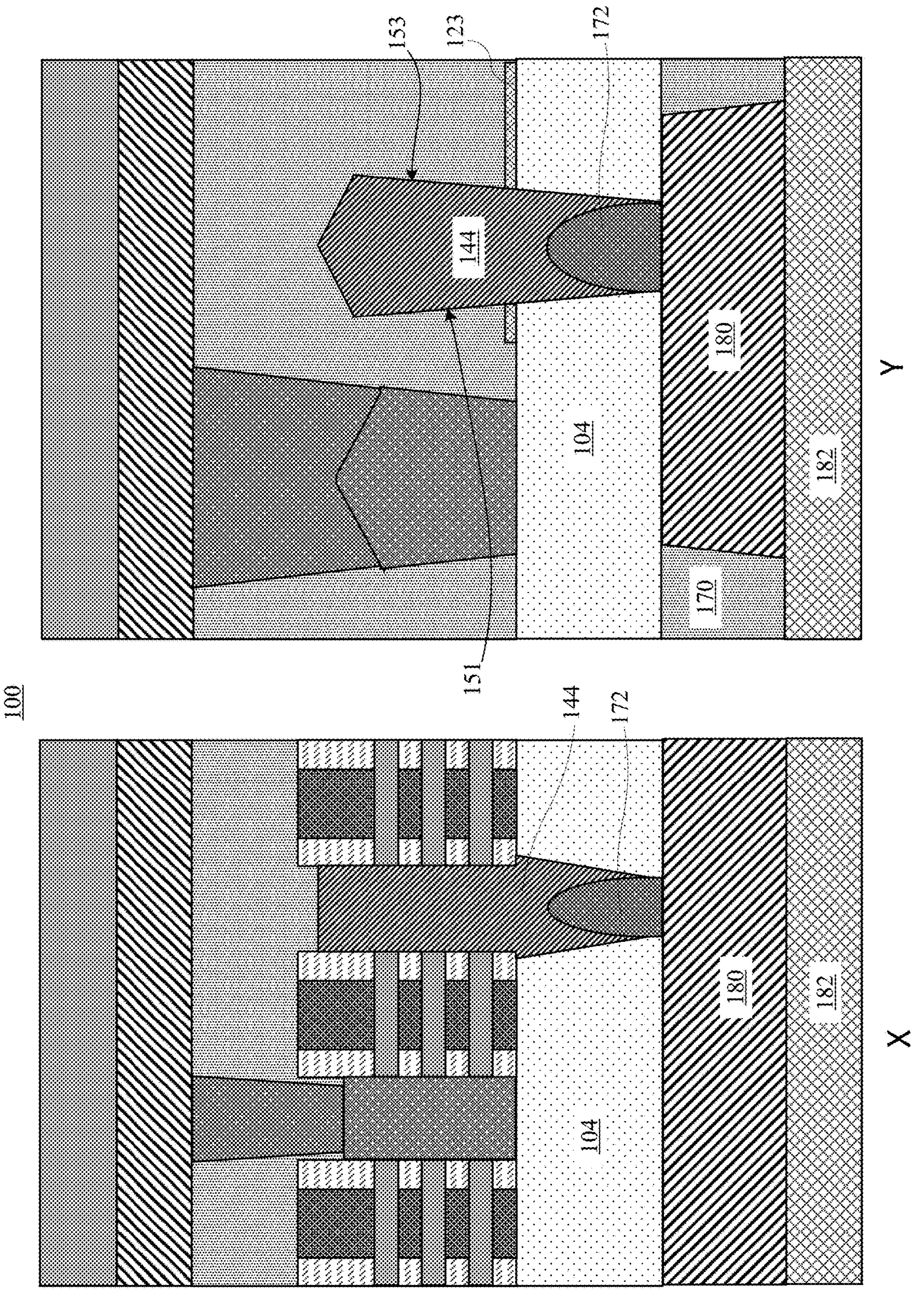
FIG. 18 depicts a cross-sectional view of a semiconductor device that includes a backside S/D at intermediate alternative stages of the fabrication process, according to embodiments.

Referring now to FIG. 18, this figure is a cross-sectional view of semiconductor device 100 after alternative fabrication operations where S/D contact 172 is formed. In this alternative fabrication operation, the S/D contact trench is formed within S/D region 144. For example, the S/D contact trench may be formed by etching a bottom portion of the S/D region 144. As depicted, the etching processes may be tuned so to form S/D region 144 sidewall footings that wrap around a perimeter of the S/D contact 172. This structure may facilitate increased contact area between the backside contact 172 and S/D region 144. Also, in this manner, the S/D contact 172 has a small top-down view radius or diameter and a relatively larger top-down view radius or diameter lower surface to promote metal or conductive material filling of the associated S/D contact trench. Such processes and techniques can save resources in fabricating semiconductor device 100 because formation of the backside contact trench for backside S/D contact 172 is self-aligned to the S/D region 144, without requiring an otherwise associated mask.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:

an insulator layer;

a transistor upon the insulator layer, the transistor includes one or more channel regions, a first source or drain (S/D) region upon the insulator layer and connected to the one or more channel regions, and a second S/D region that extends below a top surface of the insulator layer, wherein a top surface of the first S/D region is below a top surface of the second S/D region; and a liner upon a section of the insulator layer, the liner comprising a front portion in contact with a front surface of the second S/D region and a rear portion in contact with a rear surface of the second S/D region.

2. The semiconductor device of claim 1, wherein a bottom surface of the second S/D region is coplanar with a bottom surface of the insulator layer.

3. The semiconductor device according to claim 1, further comprising:

a frontside S/D contact connected to the top surface of the first S/D region.

4. The semiconductor device according to claim 1, further comprising:

a backside S/D contact connected to a bottom surface of the second S/D region.

5. The semiconductor device according to claim 4, further comprising:

a backside rail connected to a bottom surface of the backside S/D contact.

6. The semiconductor device of claim 4, wherein the second S/D region wraps around a perimeter of the backside S/D contact.

7. The semiconductor device of claim 4, wherein the first S/D region is formed of a first material and wherein the second S/D region is formed of a second material different than the first material.

8. The semiconductor device according to claim 1, wherein the transistor is a gate all around nanosheet structure that includes a plurality of channel regions each surrounded by one work function metal gate.

9. A transistor comprising:

one or more channel regions;

a single gate that is around each of the one or more channel regions;

a first source or drain (S/D) region connected to the one or more channel regions; and a second S/D region connected to the one or more channel regions, wherein a bottom surface of the second S/D region is below a bottom surface of the single gate, and wherein a top surface of the first S/D region is below a top surface of the second S/D region.

10. The transistor of claim 9, wherein the bottom surface of the second S/D region is coplanar with a backside interlayer dielectric.

11. The transistor according to claim 9, further comprising:

a frontside S/D contact connected to the top surface of the first S/D region.

12. The transistor according to claim 9, further comprising:

a backside S/D contact connected to the bottom surface of the second S/D region.

13. The transistor according to claim 12, further comprising:

a backside rail connected to a bottom surface of the backside S/D contact.

14. The transistor of claim 12, wherein the second S/D region wraps around a perimeter of the backside S/D contact.

15. The transistor of claim 12, wherein the first S/D region is formed of a first material and wherein the second S/D region is formed of a second material different than the first material.

16. The transistor according to claim 9, wherein the transistor is a gate all around nanosheet structure that includes a plurality of channel regions each surrounded by one work function metal gate.

17. A semiconductor device comprising:

nanosheet channels;

a gate around each of the nanosheet channels;

a first source or drain (S/D) region connected to the nanosheet channels and upon an insulator layer;

a second S/D region connected to the nanosheet channels and that extends through the insulator layer, wherein a top surface of the first S/D region is below a top surface of the second S/D region;

an interlayer dielectric upon the insulator layer, upon the first S/D region, and upon the second S/D region; and a liner upon the insulator layer and connected to solely the second S/D region.

* * * * *